United States Patent
Konno et al.

(10) Patent No.: US 9,591,241 B2
(45) Date of Patent: Mar. 7, 2017

(54) COMPOUND EYE OPTICAL SYSTEM AND IMAGING DEVICE USING THE SAME

(71) Applicant: KONICA MINOLTA, INC., Tokyo (JP)

(72) Inventors: Kenji Konno, Osaka (JP); Motohiro Asano, Osaka (JP); Jun Takayama, Tokyo (JP); Makoto Jin, Osaka (JP); Shoji Kogo, Tokyo (JP); Katsuya Yagi, Tokyo (JP); Hiroshi Hatano, Osaka (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 14/651,580

(22) PCT Filed: Dec. 4, 2013

(86) PCT No.: PCT/JP2013/082586
§ 371 (c)(1),
(2) Date: Jun. 11, 2015

(87) PCT Pub. No.: WO2014/091985
PCT Pub. Date: Jun. 19, 2014

(65) Prior Publication Data
US 2015/0312496 A1    Oct. 29, 2015

(30) Foreign Application Priority Data
Dec. 11, 2012  (JP) .................................. 2012-270681

(51) Int. Cl.
*H04N 5/359*   (2011.01)
*G02B 3/00*    (2006.01)
(Continued)

(52) U.S. Cl.
CPC ........... *H04N 5/359* (2013.01); *G02B 3/0056* (2013.01); *G02B 3/0062* (2013.01);
(Continued)

(58) Field of Classification Search
None
See application file for complete search history.

(56) References Cited

U.S. PATENT DOCUMENTS 7,663,662 B2 *  2/2010  Miller .............. G08B 13/19643
                                                250/330
2004/0240052 A1 * 12/2004  Minefuji ............ G02B 13/0015
                                                359/435
(Continued)

FOREIGN PATENT DOCUMENTS

JP  2006-171939   6/2006
JP  2009232278   10/2009
(Continued)

OTHER PUBLICATIONS

Bruckner et al., Thin Wafer-level camera lenses inspired by insect compound eyes, Optics Express 24379 (201) vol. 18, No. 24.

Primary Examiner — Shahbaz Nazrul
(74) Attorney, Agent, or Firm — Cozen O'Connor

(57) ABSTRACT

A compound eye optical system forms a plurality of images with different fields of view for connecting the plurality of images with the different fields of view and outputting one composite image. The system includes: a plurality of individual eye optical systems forming the plurality of images with different fields of view on an imaging surface; and an overall optical system forming an image with a field of view incorporating the entire fields of view obtained by the plurality of individual eye optical systems on the imaging surface, wherein the individual eye optical systems and the overall optical system are configured by a lens array plate having a plurality of lenses integrally formed.

11 Claims, 10 Drawing Sheets

(51) Int. Cl.
 *G02B 27/10* (2006.01)
 *H01L 27/146* (2006.01)
 *G03B 15/00* (2006.01)
 *G03B 19/07* (2006.01)
 *G03B 35/08* (2006.01)

(52) U.S. Cl.
 CPC ......... *G02B 27/1066* (2013.01); *G03B 15/00* (2013.01); *G03B 35/08* (2013.01); *H01L 27/14627* (2013.01); *G03B 19/07* (2013.01)

(56) References Cited

U.S. PATENT DOCUMENTS

| | | | | |
|---|---|---|---|---|
| 2005/0128595 | A1* | 6/2005 | Shimizu | G02B 3/0056 349/98 |
| 2005/0134712 | A1* | 6/2005 | Gruhlke | G02B 5/201 348/272 |
| 2006/0251410 | A1* | 11/2006 | Trutna, Jr. | G03B 5/02 396/55 |
| 2011/0221599 | A1* | 9/2011 | Hogasten | H01L 27/14609 340/632 |

FOREIGN PATENT DOCUMENTS

| | | |
|---|---|---|
| JP | 2010-130628 | 6/2010 |
| JP | 2010-147695 | 7/2010 |
| JP | 2011523538 | 8/2011 |
| JP | 2012-070443 | 4/2012 |
| JP | 2012151798 | 8/2012 |
| JP | 2013-45032 | 3/2013 |
| WO | WO2006101064 | 9/2006 |

\* cited by examiner

COMPOUND EYE OPTICAL SYSTEM AND IMAGING DEVICE USING THE SAME

RELATED APPLICATIONS

This is a U.S. National Phase Application under 35 USC 371 of International Application PCT/JP2013/082586 on Dec. 4 2013.

This application claims the priority of Japanese Application No. 2012-270681 filed Dec. 11, 2012, the entire content of which is hereby incorporated by reference.

TECHNICAL FIELD

The present invention relates to a compound eye optical system and an imaging device using the same, and for example, relates to a compound eye optical system of a divisional field of view type including an array lens, and an imaging device that captures a subject image obtained thereby through an imaging element (for example, a solid-state imaging element such as a CCD (Charge Coupled Device) type image sensor or a CMOS (Complementary Metal-Oxide Semiconductor) type image sensor).

BACKGROUND ART

In recent years, imaging optical systems have been strongly desired to be thinner. In order to deal with the shortening of the overall length by the optical design or the increase in error sensitivity caused thereby, the manufacturing accuracy has been improved; however, for dealing with the further desires, simply forming an image with one optical system and one imaging element as conventionally conducted has been insufficient. Therefore, an imaging optical system called a compound eye optical system has attracted attention for dealing with the desire for the thickness reduction. The compound eye optical system is an array optical system including a plurality of lenses disposed in the array shape, and forms an image with respect to an imaging region divided into a plurality of pieces in the imaging element. The obtained plural images are processed to be one image finally and output.

Various compound eye optical systems have been suggested in Patent Literatures 1 to 3 and Non-Patent Literature 1. For example, the compound eye optical system according to Patent Literature 1 includes a plurality of array optical systems that images the same field of view, and performs the super-resolution process using a small amount of difference in parallax thereof. The compound eye optical system according to Non-Patent Literature 1 is to divide the field of view with the decentering of one array optical system, and the compound eye optical system according to Patent Literatures 2 and 3 is to divide the field of view with the prism for changing the optical path.

CITATION LIST

Patent Literatures

Patent Literature 1: JP 2011-523538 T
Patent Literature 2: JP 2012-151798 A
Patent Literature 3: JP 2009-232278 A

Non-Patent Literature

Non-Patent Literature 1: 22 Nov. 2010/Vol. 18, No. 24/OPTICS EXPRESS 24379

SUMMARY OF INVENTION

Technical Problem

Since the super-resolution process performed using the compound eye optical system according to Patent Literature 1 requires the complicated image processing, the calculation takes a long time, which results in problems that the consecutive imaging is difficult and the quality of the output image is not high. On the other hand, in the compound eye optical system according to Non-Patent Literature 1, the increase in pixels is difficult and in the compound eye optical systems according to Patent Literatures 2 and 3, the thickness reduction is difficult because of the presence of the prism. In this manner, the compound eye optical systems conventionally known have the problems that the drastic thickness reduction and the increase in pixels cannot be achieved at the same time.

The present invention has been made in view of the above problems and an object thereof is to provide a compound eye optical system with very small thickness and high image quality, and an imaging device using the same.

Solution to Problem

In order to achieve the above object, a compound eye optical system of a first invention is a compound eye optical system that forms a plurality of images with different fields of view for connecting the plurality of images with the different fields of view and outputting one composite image, including: a plurality of individual eye optical systems forming the plurality of images with different fields of view on an imaging surface; and an overall optical system forming an image with a field of view incorporating the entire fields of view obtained by the plurality of individual eye optical systems on the imaging surface, wherein the individual eye optical systems and the overall optical system are configured by a lens array plate having a plurality of lenses integrally formed.

According to the compound eye optical system of a second invention, in the first invention, the imaging surface is in one imaging element.

According to the compound eye optical system of a third invention, in the first or second invention, the lens array plate includes at least two pieces.

An imaging device of a fourth invention is an imaging device including: an imaging element; a compound eye optical system forming a plurality of images with different fields of view for the imaging element; and an image processing unit that connects the plurality of images with the different fields of view formed by the compound eye optical system and outputs one composite image, wherein the compound eye optical system includes a plurality of individual eye optical systems that forms the plurality of images with different fields of view on an imaging surface of the imaging element, and an overall optical system that forms an image with a field of view incorporating the entire fields of view obtained by the plurality of individual eye optical systems on the imaging surface, and the individual eye optical systems and the overall optical system are configured by a lens array plate having a plurality of lenses integrally formed.

According to the imaging device of a fifth invention, in the fourth invention, the imaging surface is in one imaging element.

According to the imaging device of a sixth invention, in the fourth or fifth invention, the lens array plate includes at least two pieces.

According to the imaging device of a seventh invention, in any one of the fourth to sixth inventions, the image processing unit corrects to improve image quality of the composite image using information of the image obtained by the overall optical system.

According to the imaging device of an eighth invention, in the seventh invention, the field of view of the overall optical system is larger than the entire fields of view obtained by the plurality of individual eye optical systems.

According to the imaging device of a ninth invention, in the seventh or eighth invention, the information of the image obtained by the overall optical system is crosstalk that causes ghost, and the image processing unit identifies the crosstalk caused in the composite image and corrects to make the ghost less visible.

According to the imaging device of a tenth invention, in any one of the seventh to ninth inventions, the information of the image obtained by the overall optical system is shading and the image processing unit corrects luminance distribution of the composite image using luminance distribution information of the image of the overall optical system.

According to the imaging device of an eleventh invention, in any one of the seventh to tenth inventions, the information of the image obtained by the overall optical system is a seam of the composite image and the image processing unit corrects seam distribution of the composite image using the image information of the overall optical system.

According to the imaging device of a twelfth invention, in any one of the fourth to eleventh inventions, the image processing unit has a function of outputting a moving image, a function of outputting a live view, and a function of outputting a still image, and in the output of a still image, the image processing unit performs image processing for outputting the composite image and in the output of a moving image or live view, the image processing unit outputs using the image information of the overall optical system.

According to the imaging device of a thirteenth invention, in any one of the fourth to twelfth inventions, when it is assumed that the image formed by the individual eye optical system is an individual eye image, the image formed by the overall optical system is an overall image, and regions where the individual eye image and the overall image are formed on the imaging surface of the imaging element are an individual eye region and an overall region, respectively, a space between the individual eye region and the overall region is larger than a space between the individual eye regions.

According to the imaging device of a fourteenth invention, in any one of the fourth to thirteenth inventions, other individual eye optical systems than the individual eye optical system having an optical axis perpendicular to the imaging surface are decentered optical systems with at least one free-form surface.

According to the imaging device of a fifteenth invention, in any one of the fourth to fourteenth inventions, when the image formed by the individual eye optical system is an individual eye image, peripheries of the fields of view of the individual eye images are overlapped on each other and the amount of overlapping satisfies the condition formula (1):

$$0.01 < La/Lb < 0.5 \tag{1}$$

where La is the amount of overlapping and Lb is the width of a screen in an overlapping direction.

According to the imaging device of a sixteenth invention, in any one of the fourth to fifteenth inventions, the number of individual eye optical systems is three or more in each of vertical and horizontal directions, so that the individual eye optical systems form the images with the fields of view displaced in the vertical and horizontal directions in 3×3 or more array.

Advantageous Effects of Invention

According to the structure of the present invention, the image quality can be improved without increasing the thickness of the compound eye optical system. Therefore, the compound eye optical system with very small thickness and high image quality, and the imaging device with very small thickness and high image quality using the same can be achieved. Further, by applying the compound eye optical system according to the present invention to a digital appliance such as a mobile phone or a portable information terminal, the sophisticated image input function can be compactly provided for the digital appliance.

DESCRIPTION OF EMBODIMENTS

Figure 1:
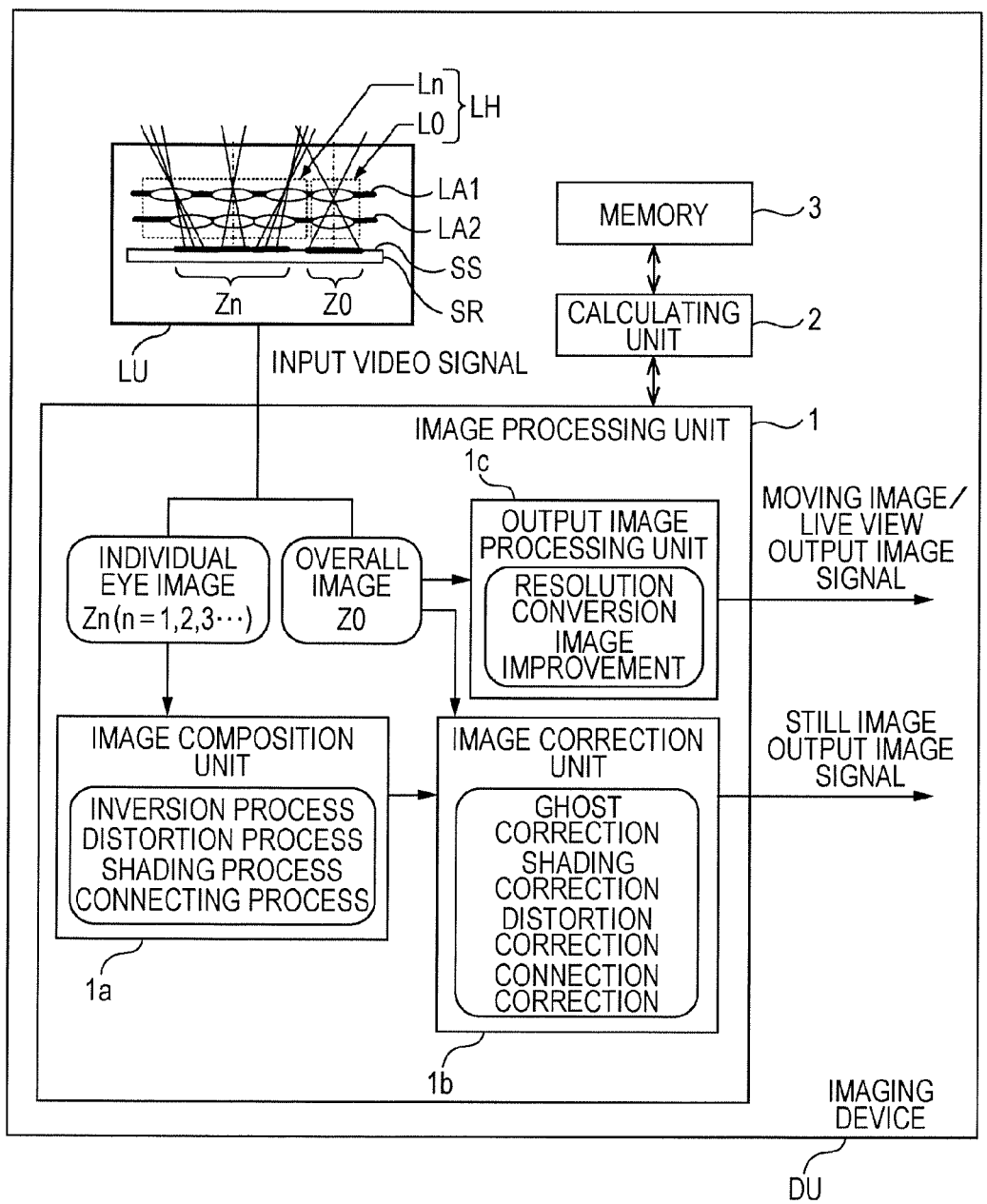
FIG. 1 is a schematic view illustrating a first embodiment of an imaging device.

A compound eye optical system and an imaging device according to the present invention and the like are hereinafter described. Note that the same portion or the corresponding portions in the embodiments and the like are denoted by the same reference symbol and the overlapping description is omitted as appropriate.

The compound eye optical system is an optical system having a plurality of lens systems arranged in an array shape relative to an imaging element, and generally classified into a super-resolution type in which the lens systems image the same field of view and a divisional field of view type in which the lens systems image different fields of view. The compound eye optical system according to the present invention is the divisional field of view type that forms plural images with different fields of view in order to connect the plural images with the different fields of view and output one composite image.

The compound eye optical system according to the present invention includes a plurality of individual eye optical systems that forms the plurality of images with the different fields of view on an imaging surface of an imaging element (for example, a photo-electric converter of a solid-state imaging element), and an overall optical system that forms the image of a field of view incorporating the entire fields of view obtained by the plural individual eye optical systems, wherein the individual eye optical systems and the overall optical system are configured by a lens array plate having a plurality of lenses integrally formed. The imaging surface is preferably in one imaging element (i.e., the same imaging element). The structure in which the plurality of individual eye optical systems forms the plural images with different fields of view on the imaging surface of one imaging element can achieve the size reduction of the entire imaging device effectively. Moreover, the lens array plate preferably includes at least two pieces. At least two lenses can secure the more excellent optical performance. The imaging device according to the present invention includes the imaging element, the compound eye optical system that forms the plural images with different fields of view for the imaging element, and the image processing unit that connects the plural images with different fields of view formed by the compound eye optical system to output one composite image.

The compound eye optical systems of both types are suitable for reducing the thickness of the imaging device; in particular, the divisional field of view type is effective in achieving the size reduction of the entire optical system because each piece performs the imaging in the small field of view. For obtaining one composite image from the plural images with different fields of view, however, it is necessary to perform the image processing of rotating each image and then attaching the image because the images are inverted on the imaging element by the operation of the lens. On this occasion, in the case of using the optical system that performs the imaging of the different field of view by causing decentering using the integrally formed lens array plate, the problems (1) to (3) as below are caused.

(1): The unnecessary light having entered the individual eye reaches the adjacent sensor surface, so that the stray light ghost due to the reflection between the planes or the crosstalk is caused.

(2): The shading of each lens system becomes asymmetry in relation to the decentered direction of the individual eye, causing the luminance level at the attachment boundary to vary.

(3): The parallax different from the ideal state is caused due to the lens adjustment deviation or the difference in subject distance, causing the connected portion to be deviated.

The problems can be solved by using the information of each lens system; however, since the actual state of the image cannot be known just by the information of each lens system, the solution has a limitation. In view of this, the compound eye optical system according to the present invention has the structure in which the plural individual eye optical systems form the plural images with different fields of view on the imaging surface and the overall optical system forms the image with the field of view incorporating the fields of view obtained by the plural individual eye optical systems on the imaging surface. Since the structure having the overall optical system enables the information of the actual image to be obtained more accurately, the accurate correction can be made for the problems (1) to (3). In other words, from the image information obtained using the overall optical system, the trouble such as the ghost, shading, connecting, or distortion can be corrected. Moreover, since both the images formed by the individual eye optical systems and the image formed by the overall optical system can be formed on one imaging element, the size reduction of the entire imaging device can be achieved more effectively. For reducing the deviation of the individual field of view from the ideal state (design value) and moreover reducing the size of the entire imaging device, they are preferably mounted on the same board.

According to the above characteristic structure, the image quality can be improved without increasing the thickness of the compound eye optical system. Therefore, the compound eye optical system with very small thickness and high image quality, and the imaging device with very small thickness and high image quality having the same can be achieved. Further, by using the compound eye optical system according to the present invention to a digital appliance such as a mobile phone or a portable information terminal, the sophisticated image input function can be compactly provided for the digital appliance and thus the present invention can contribute to the compactness, sophistication, higher functionality, etc. Description is hereinafter made of the condition for achieving the effects uniformly and achieving higher optical performance, size reduction, and the like.

In the imaging device, the image processing unit preferably performs the correction for improving the image quality of the composite image using the information of the image obtained by the overall optical system. By using the information of the image obtained by the overall optical system, the image quality of the composite image (individual eye composite image) restored from the image obtained by the individual eye optical system can be improved.

Figure 5A:
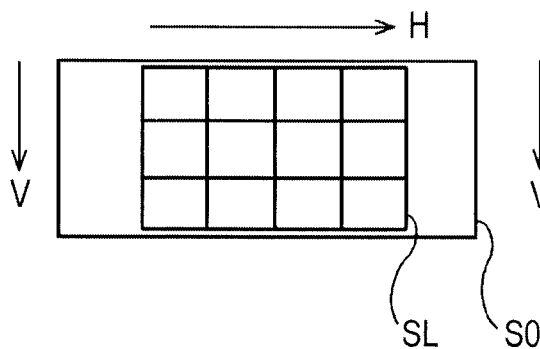
FIG. 5 is a plan view illustrating the positional relation between the field of view obtained by the overall optical system and the composite field of view obtained by the individual eye optical system.
Figure 5B:
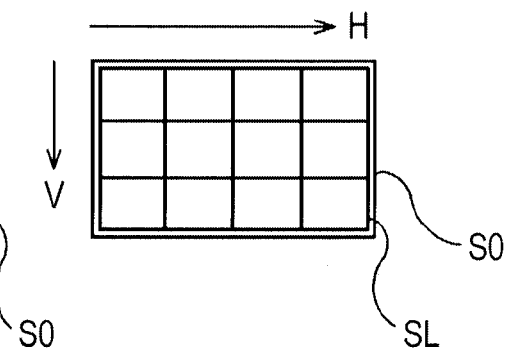

The field of view of the overall optical system (overall field of view) is preferably larger than the entire field of view (composite field of view) obtained by the plural individual eye optical systems. FIGS. 5A and 5B illustrate an example of the positional relation between an overall field of view S0 obtained by the overall optical system and a composite field of view SL obtained by the individual eye optical systems (V: short-side direction, H: long-side direction). The image information obtained by the overall optical system can be used for the moving image or live view. The screen size of the moving image is 16:9 and the screen size of the live view is horizontally long (FIG.5A) as compared to the screen size 4:3 (FIG. 5B) of the general still image because the size of the live view corresponds to the screen size of the image display device (for example, liquid crystal display device) of an appliance to which the imaging device is mounted (such as a smart phone (highly functional mobile phone)). If the overall optical system is the image cut of a part of the region of the entire individual eye optical systems, the still image region cannot be fully contained, which is not preferable as the live view. Thus, the overall field of view S0 obtained by the overall optical system is preferably larger than the composite field of view SL obtained by the plural individual eye optical systems, whereby the image quality of the composite image using the information of the image obtained by the overall optical system can be effectively improved.

Figure 6:
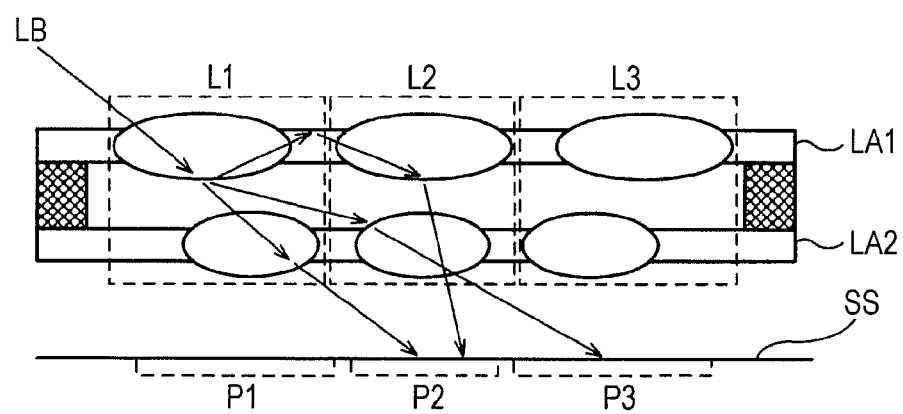
FIG. 6 is a diagram for describing the crosstalk correction.

The information of the image obtained by the overall optical system is the crosstalk that causes the ghost, and the image processing unit preferably identifies the crosstalk caused in the composite image and corrects to make the ghost less visible. The crosstalk refers to the incidence of light, which is emitted from a particular optical system, into a sensor region which is different from a sensor region that the light originally should enter. The crosstalk refers to the phenomenon in which, for example, as illustrated in FIG. 6, the light LB incident into a lens system L1 among lens systems L1 to L3 including lens array plates LA1 and LA2 does not enter a sensor region P1, to which the light LB should originally be incident on an imaging surface SS, but enters the lens systems L2 and L3 in the vicinity and then enters sensor regions P2 and P3. The crosstalk as above easily occurs when the integrated lens array such as the lens array plates LA1 and LA2 is used.

Figure 11:
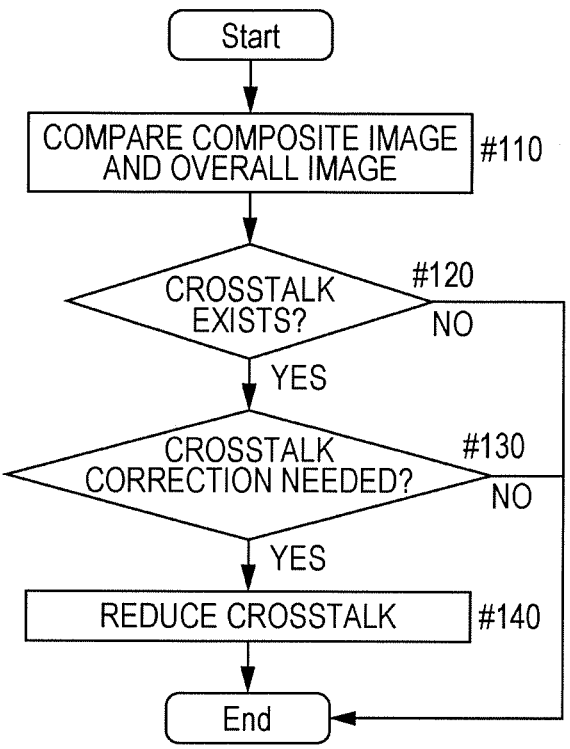
FIG. 11 is a flowchart illustrating the control operation of the crosstalk correction.

FIG. 11 is a flowchart illustrating the control operation of the crosstalk correction. For removing the crosstalk, two steps are executed: (1) a process of identifying the ghost, and (2) a process of reducing the ghost. In the process of identifying the ghost, the luminance value of the overall image is compared with that of the composite image obtained from the plural individual eye images and the place where there is a large difference in luminance value (place where the crosstalk has occurred) is identified (#110). Upon the determination that the crosstalk has been caused (#120) and the crosstalk is in the degree that it should be corrected (#130), the process of reducing the crosstalk (process of reducing the ghost) is performed (#140). In the process of reducing the crosstalk, the subtraction process is performed by the amount of difference in luminance value from the composite image. In this manner, by using the image information obtained by the overall optical system in the crosstalk reducing process, the effective correction can be performed to make the ghost less visible.

The processes are specifically described in, for example, JP 2012-70443 A. The process described in JP 2012-70443 A does not correct the crosstalk of the compound eye optical system but, if the screen contains the high luminance portion, predicts the occurrence of the ghost and detects whether there is the ghost or not by matching the acquired image and improves the image quality by the subtraction process. Since the process of identifying the ghost and the subtraction process are principally the same as the processes of the crosstalk correction in the present invention, the crosstalk can be corrected by applying the processes. Moreover, as described in JP 2012-70443 A, a removal determination step may be provided between the identifying process and the subtraction process.

Figure 7A:
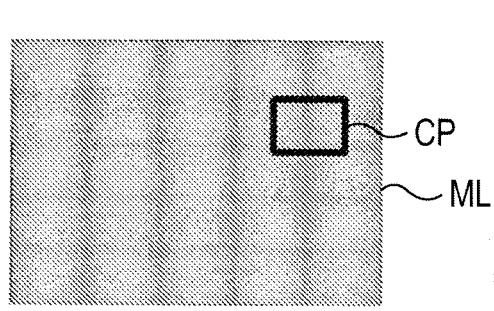
FIG. 7 is a diagram for describing the shading correction.
Figure 7B:
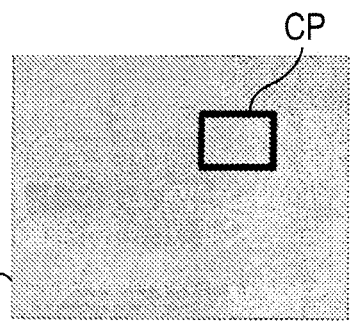
Figure 7C:
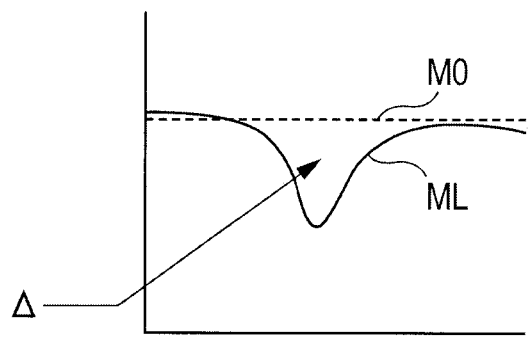
Figure 8A:
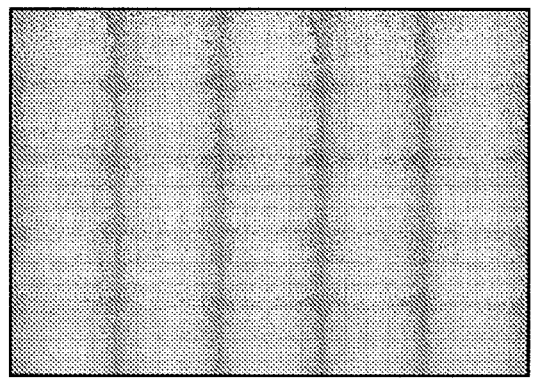
FIG. 8 is a diagram expressing the results of photographing a gray chart before and after the shading correction.
Figure 8B:
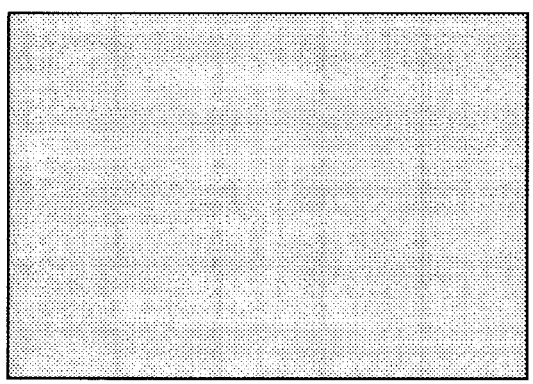

The information of the image obtained by the overall optical system is the shading and the image processing unit preferably corrects the luminance distribution of the composite image using the luminance distribution information of the image of the overall optical system. FIG. 7A shows an example of the individual eye composite image ML, and FIG. 7B shows an example of the overall image M0. Moreover, FIG. 7C shows the change (Δ: luminance difference) in a region CP in FIG. 7A and FIG. 7B. As shown in FIG. 7A, since the illuminance distribution obtained by the individual eye optical system is not uniform, the luminance may be non-uniform due to the shading of the individual eye optical system in the vicinity of the portion where the composite image is attached. Although a certain degree of correction is possible with the calibration in advance, the correction in all the luminance levels is difficult and the drastic luminance change may remain in the attached portion. If the overall image is not present, it is impossible to determine whether this change is caused by the subject or the remainder of the connecting. However, this can be determined by using the image information obtained by the overall optical system and the shading can be corrected. An example of results of photographing the gray chart is shown in FIG. 8: (A) shows the result before the shading correction and (B) shows the result after the shading correction.

Figure 12:
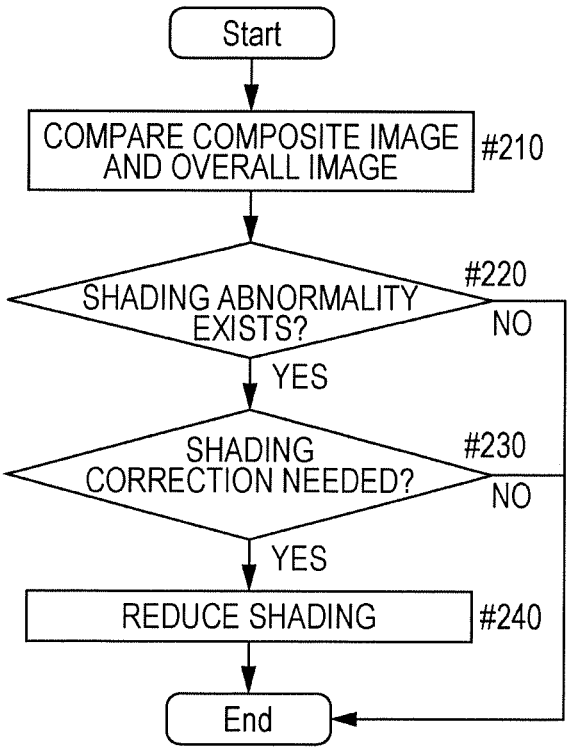
FIG. 12 is a flowchart illustrating the control operation of the shading correction.

FIG. 12 is a flowchart illustrating the control operation of the shading correction. The shading correction includes two steps of (1) determining whether the shading has occurred or not, and (2) a process of reducing the shading. In the determination as to whether the shading has occurred or not, the luminance values of the overall image and the individual eye composite image obtained from a plurality of individual eye images are compared and the place where there is a large difference in the luminance value (where the shading has occurred) is identified (#210). In particular, the luminance values are compared in the vicinity of the seam, and if the luminance difference in the vicinity portion is more than or equal to a certain amount, it is determined that the shading has occurred. For example, in the individual eye composite image ML shown in (A) of FIG. 7 and the overall image M0 shown in (B) of FIG. 7, the luminance of the section of the region CP (vicinity of seam) surrounded by a square or the region CP is compared and if the luminance difference Δ is more than or equal to a certain amount, it is determined that the shading abnormality is in the prominent level.

If it has been determined that the shading abnormality has occurred (#220) and this shading requires the correction (#230), the process of reducing the shading is performed (#240). In the process of reducing the shading, since the luminance distribution of the overall image M0 is close to the original luminance, the luminance of the individual eye composite image ML is changed to reduce the luminance difference Δ. On this occasion, it is desirable that the level to be corrected is adjustable.

Figure 9A:
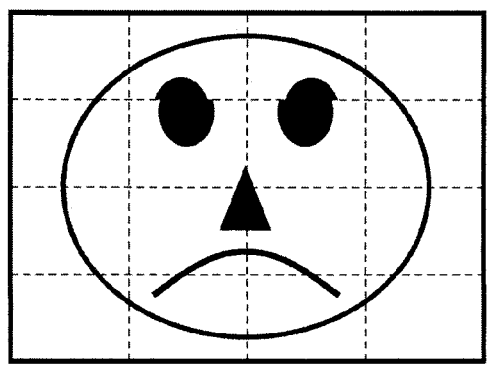
FIG. 9 is a diagram illustrating the composite image before and after the connection correction.
Figure 9B:
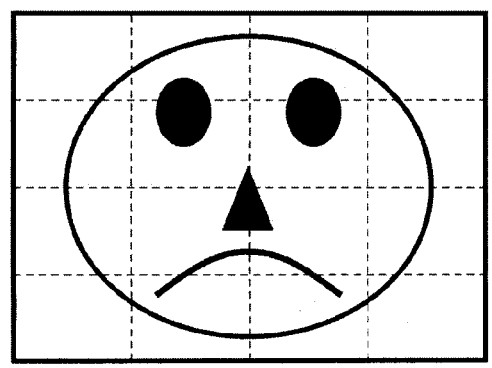
Figure 10A:
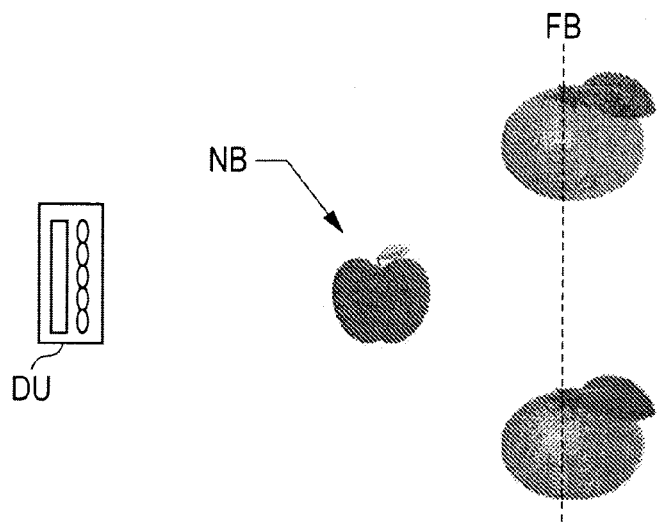
FIG. 10 is a diagram illustrating the influence of the parallax due to the difference in subject distance on the connection.
Figure 10B:
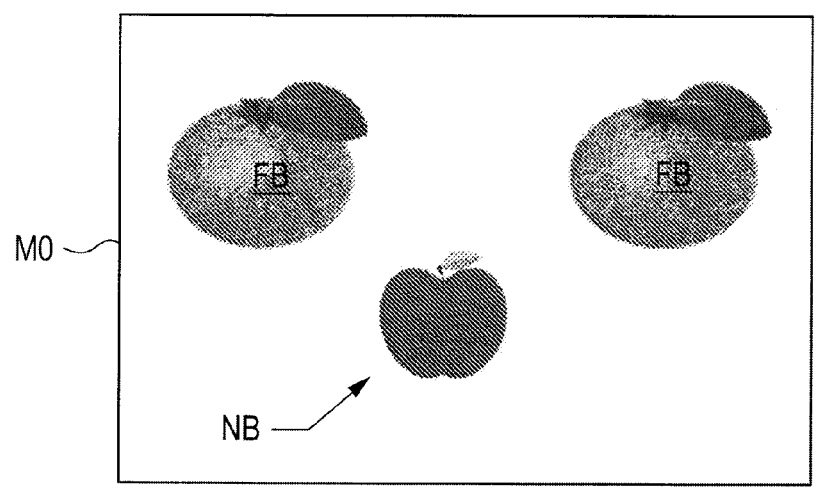
Figure 10C:
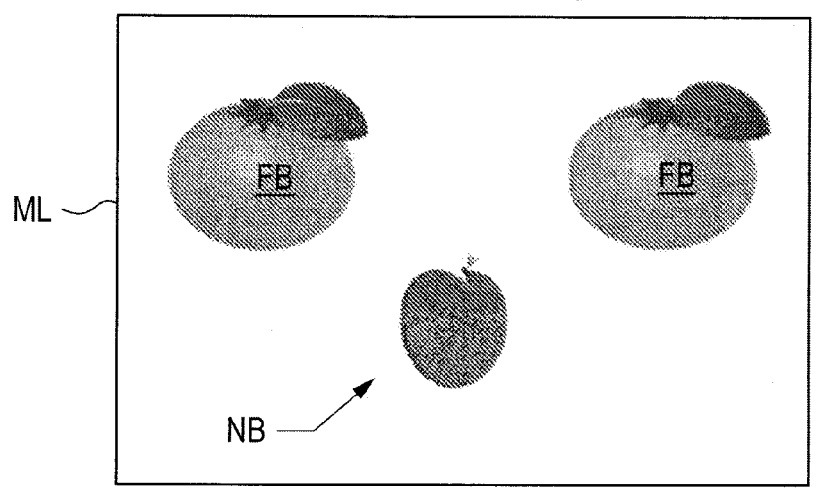

The information of the image obtained by the overall optical system is the seam of the composite image and the image processing unit preferably corrects the seam distribution of the composite image using the image information of the overall optical system. FIG. 9A shows the composite image before the seam correction and FIG. 9B shows the composite image after the seam correction. FIG. 10 illustrates the influence of the parallax due to the difference in subject distance on the seam. FIG. 10A illustrates the state in which a near distance object NB and a reference distance object FB are photographed by an imaging device DU, FIG. 10B illustrates the overall image M0, and FIG. 10C illustrates the individual eye composite image ML.

As illustrated in FIGS. 9 and 10, in some cases, the individual eye images are not connected seamlessly due to the influence of the displacement of the center of the lens by the temperature fluctuation or the change in parallax due to the subject distance (difference in distance due to the parallax of the adjacent lens systems). By comparing the composite image and the overall image, the error determination for the displacement of the attachment can be performed. In other words, whether the subject is curved drastically in fact or there is an influence of the error in the attachment can be determined. If it has been determined that the error in the attachment has occurred, the correction process is performed (image is moved to eliminate the displacement and the space is filled by using the information of the region in the overlapping field of view to make it seamless), whereby the unnatural seams can be corrected.

Figure 13:
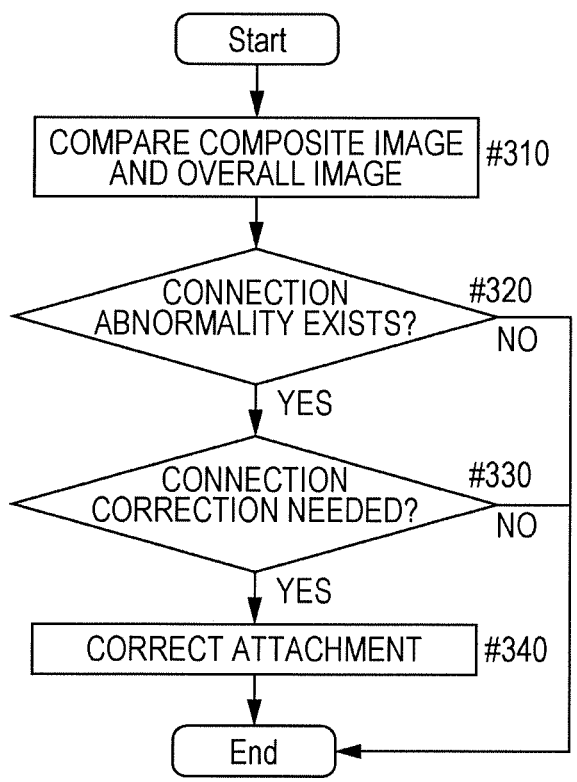
FIG. 13 is a flowchart illustrating the control operation of the connection correction.

FIG. 13 is a flowchart illustrating the control operation for the seam correction. The seam correction includes two steps of (1) a process of identifying the seam abnormality and (2) a process of correcting the attachment. In the process of identifying the seam abnormality, the luminance values are compared between the overall image and the composite image obtained from a plurality of individual eye images, and the place where there is a large difference in the luminance value (where the seam abnormality has occurred) is identified (#310). If it has been determined that the seam abnormality has occurred (#320) and this seam abnormality requires the correction (#330), the process of correcting the attachment (process of reducing the seam abnormality) is performed (#340). In this manner, by using the image information obtained by the overall optical system in the seam correction process, the effective seam correction can be performed for making the unnatural seams less visible.

The image processing unit has a function of outputting a moving image, a function of outputting a live view, and a function of outputting a still image. In the output of a still image, the image processing unit performs image processing for outputting the composite image; in the output of a moving image or live view, the image processing unit preferably outputs using the image information of the overall optical system. When the photographing operation is performed with the present imaging device incorporated in a mobile appliance, usually, the photographing is performed while the photographing condition is checked on a display screen of a liquid crystal or organic EL (Organic Electroluminescence) of the mobile appliance. On this occasion, displaying the composite image of the individual eye optical system on the display screen requires the quick composite calculation. Such a calculation process, however, burdens so much that problems occur in that the process cannot catch up with the speed and the consumption power is increased to cause large heat generation. Therefore, the overall image is displayed instead of the composite image, which does not need the inversion process or the attachment calculation, whereby the quick and low-power-consumption output of live view becomes possible. Further, in the photographing of the moving image, the overall image is preferably used similarly. On this occasion, since the HD image quality is necessary in the moving image, the process of up-converting the overall image may be performed.

When it is assumed that the image formed by the individual eye optical system is an individual eye image, the image formed by the overall optical system is an overall image, and the regions where the individual eye image and the overall image are formed on the imaging surface of the imaging element are the individual eye region and the overall region, respectively, the space between the individual eye region and the overall region is preferably larger than the space between the individual eye regions. For making the individual eye optical system decentered in order to divide the field of view, the space between the individual eye region and the overall region needs to be formed to be large so as to avoid the interference with the overall optical system. Moreover, since the decentering of the individual eye optical system changes in the order of the arrangement, the interference between the individual eye optical systems can be easily avoided but the interference between the individual eye optical system and the overall optical system cannot be avoided easily. Therefore, the space between the individual eye region and the overall region (for example, 2 mm) is preferably set larger than the space between the individual eye optical system regions (for example, 0.2 mm). In this structure, a light blocking member can be disposed there for preventing the crosstalk; therefore, the influence of the crosstalk can be reduced to be smaller in the overall optical system than in the individual eye optical system and the excellent image can be obtained.

Among the plural individual eye optical systems, other individual eye optical systems than the individual eye optical system having an optical axis perpendicular to the imaging surface (for example, the individual eye optical system constituting the center of the composite field of view) is preferably the decentered optical systems having at least one free-form surface. For reducing the thickness of the compound eye optical system of the divisional field of view type, the decentering is necessary (in order to omit the optical path changing prism, which would cause the thickness increase). However, the aberration correction is necessary for the oblique light incidence in the decentered optical system. To achieve the higher performance by the aberration correction, the individual eye optical system having the decentered surface preferably has a free-form surface and the entire decentered lens except the individual eye optical system having the optical axis perpendicular to the imaging surface preferably have two or more free-form surfaces.

When the image formed by the individual eye optical system is the individual eye image, the peripheries of the fields of view of the individual eye images are overlapped on each other and the amount of overlapping preferably satisfies the condition formula (1):

$$0.01 < La/Lb < 0.5 \tag{1}$$

where La is the amount of overlapping and Lb is the width of the screen in the overlapping direction.

For performing the process of connecting the individual eye images, the image overlapping region (region to view the same place with the adjacent individual optical systems) is necessary but the regions are preferably not so many in order to effectively use the number of pixels of the sensor. The condition formula (1) defines the condition preferable for maintaining the number of composite pixels to be high while having the necessary overlapping.

The number of individual eye optical systems is preferably three or more in each of the vertical and horizontal directions, so that the individual eye optical systems form the images in the fields of view displaced in the vertical and horizontal directions in the 3×3 array. For obtaining the viewing angle in the divisional field of view, at least 3×3 array is necessary.

Figure 2:
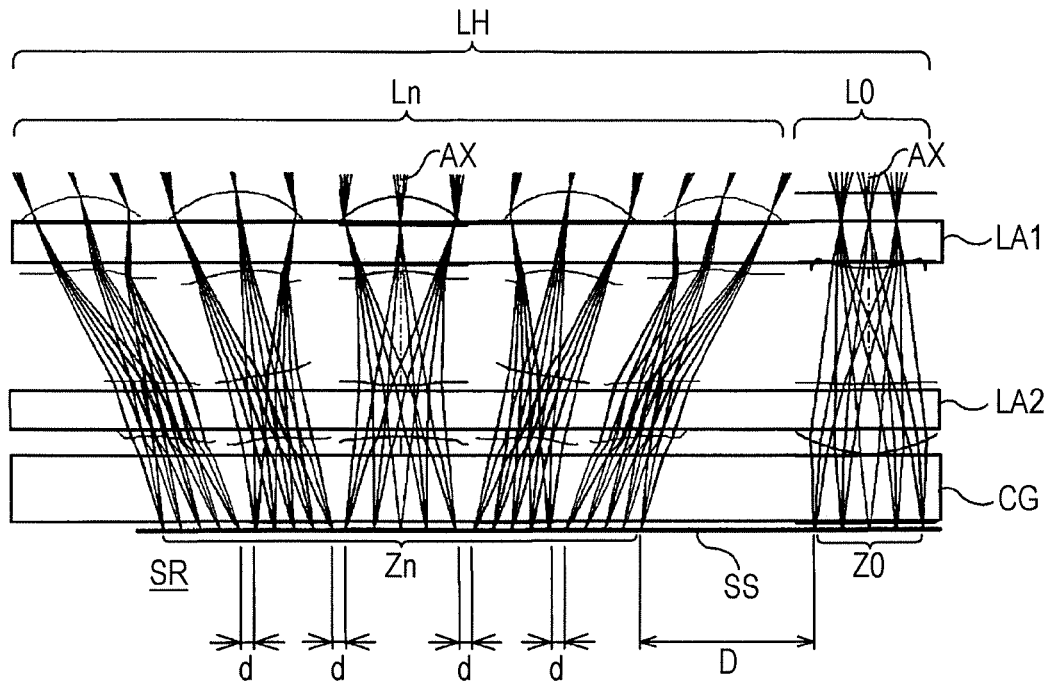
FIG. 2 is an optical structure diagram illustrating a first embodiment of a compound eye optical system.
Figure 3:
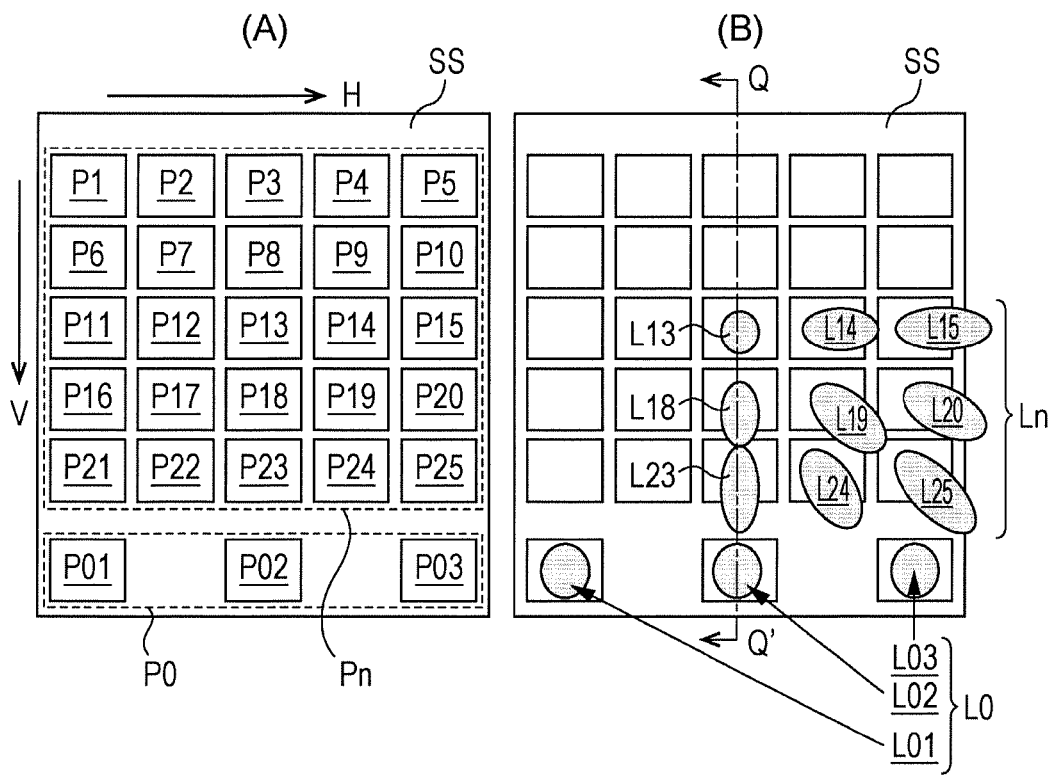
FIG. 3 is a plan view for describing the positional relation between the compound eye optical system and the imaging region in the first embodiment.

FIG. 1 illustrates the first embodiment of the imaging device, FIG. 2 illustrates the first embodiment of the compound eye optical system, and FIG. 3 illustrates the positional relation between the compound eye optical system and the imaging region in the first embodiment. As illustrated in FIG. 1, the imaging device DU includes an imaging unit LU, an image processing unit 1, a calculating unit 2, and a memory 3, and the like. The imaging unit LU includes one imaging element SR and a compound eye optical system LH forming images with the different fields of view for the imaging element SR. As the imaging element SR, for example, a solid-state imaging element such as a CCD type image sensor having a plurality of pixels or a CMOS type image sensor is used. The compound eye optical system LH is provided to form the optical image of the subject on the light reception surface SS, which is the photoelectric conversion unit of the imaging element SR; therefore, the optical image formed by the compound eye optical system LH is converted into electric signals by the imaging element SR.

As illustrated in FIG. 1 and FIG. 2, the compound eye optical system LH includes a plurality of individual eye optical systems Ln (n=1, 2, 3, . . . ) forming a plurality of individual eye images Zn (n=1, 2, 3, . . . ) with different fields of view on the imaging surface SS of the imaging element SR, and an overall optical system L0 forming the overall image Z0 with the field of view incorporating the entire fields of view obtained by the individual eye optical systems Ln on the imaging surface SS. Each of the individual eye optical systems Ln and the overall optical system L0 includes two lenses of an object side lens and an image side lens, and is formed by a first lens array plate LA1 having a plurality of object side lenses integrated and a second lens array plate LA2 having a plurality of image side lenses integrated. Note that a cover glass CG of the imaging element SR is disposed as illustrated in FIG. 2 on the image side of the second lens array plate LA2.

Figure 3A:
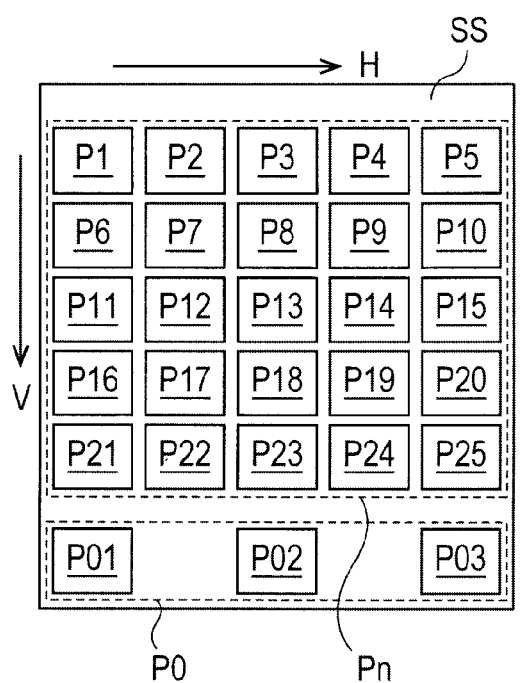
Figure 3B:
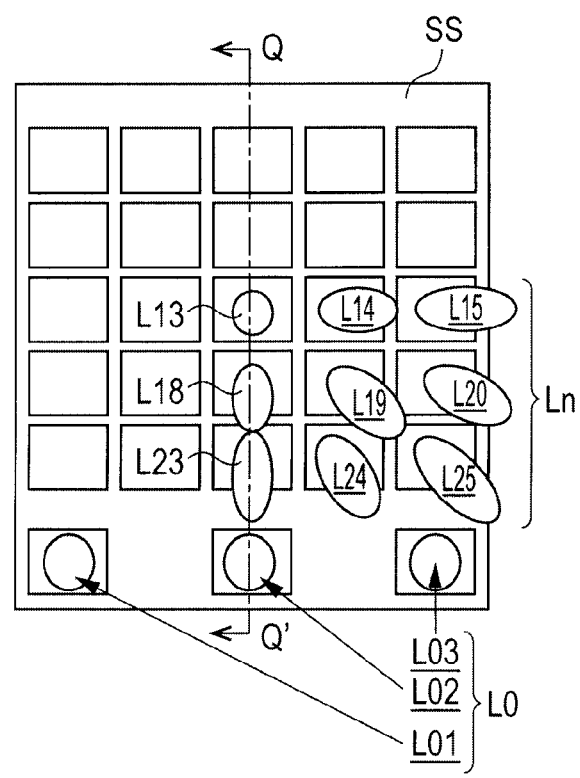

In FIG. 3A, the individual eye regions Pn (n =1, 2, 3, . . . ) where the individual eye images Zn are formed by the individual eye optical systems Ln and the overall regions P0 (P01 to P03) where the overall image Z0 is formed by the overall optical system L0 on the imaging surface SS of the imaging element SR are illustrated as the imaging regions. FIG. 3B further illustrates some of the individual eye optical systems Ln (L13 to L15, L18 to L20, L23 to L25) forming the individual eye images Zn (FIG. 1, FIG. 2) in the individual eye regions Pn (FIG. 3A), and the overall optical systems L0 (L01 to L03) forming the overall images Z0 (FIG. 1, FIG. 2) in the overall regions P0 (FIG. 3A). A circular shape in FIG. 3B illustrates the state in which the individual eye optical system Ln and the overall optical system L0 are viewed from above (for example, an elliptical shape illustrates the decentered state of the lens system). Note that FIG. 2 corresponds to a sectional view (one section in the V direction) taken along a line Q-Q' of FIG. 3B but since the individual eye optical systems Ln are disposed symmetrical vertically and horizontally, just the individual eye optical systems Ln at nine positions (L13 to L15, L18 to L20, L23 to L25) are shown in FIG. 3B.

In the first embodiment, the field of view is divided into 5×5; therefore, as FIG. 3 indicates, the individual eye optical systems Ln and the individual eye regions Pn are arranged in accordance with the 5×5 array. The individual eye optical system L13 in the center forms the image of the center part of the subject, and the individual eye optical system Ln (other than L13) in the periphery forms the image in the portion around the subject. However, since the field of view is divided, the viewing angle of any individual eye optical system Ln is narrow.

As illustrated in FIG. 2, any of the individual eye optical systems Ln is formed of two lenses and in the individual eye optical system L13 in the center shown in FIG. 3(B) (having an optical axis AX perpendicular to the imaging surface SS), the lenses are in the power arrangement of the positive and negative telephoto type. In the individual eye optical systems Ln other than the central individual eye optical system L13, the four lens surfaces are free-form surfaces. By having the four free-form surfaces, the excellent aberration performance can be achieved. In the individual eye optical systems Ln other than the central individual eye optical system L13, the optical axis AX is decentralized for forming the peripheral fields of view; thus, the prism and the like for changing the optical path are not necessary. Therefore, the entire individual eye optical systems Ln can have the equal thickness and can be designed on the same substrate. Since the individual eye optical systems Ln forming the peripheral fields of view have the light enter obliquely the imaging surface SS, it is preferable that the optical systems have the four free-form surfaces in order to achieve the optical performance similar to that of the axially-symmetrical optical system.

Below the individual eye optical systems Ln are provided three lens systems L01 to L03 with the same structure (power arrangement of the negative and positive wide angle type) as the overall optical systems L0. Any of the three overall optical systems L01 to L03 has the lens system (with the optical axis AX perpendicular to the imaging surface SS) that forms the image of the entire subject and has the viewing angle five times as large as that of the individual eye optical system Ln. The overall optical system L0 included in the compound eye optical system LH may be one or more than one. When the overall optical system L0 is disposed together with the individual eye optical system Ln, enough space is formed, so that a plurality of overall optical systems L0 can be disposed. For example, if the plural overall optical systems L0 are used, the plural images obtained thereby can be used in the output of the distance information or the 3-D image.

The image processing unit 1 includes an image composition unit 1a, an image correction unit 1b, and an output image processing unit 1c. The image composition unit 1a connects a plurality of individual eye images Zn (n=1, 2, 3 . . . ) with the different fields of view formed by the compound eye optical system LH, and outputs one individual eye composite image ML (FIG. 7, etc.). On this occasion, an inversion process, a distortion process, a shading process, a connecting process, or the like is performed. The image correction unit 1b corrects to improve the image quality of the individual eye composite image ML using the information of the overall image M0 obtained by the overall optical system L0, thereby improving the image quality of the individual eye composite image ML restored from the individual eye images Zn obtained by the individual eye optical systems Ln. In other words, the image correction unit 1b identifies the crosstalk occurred in the individual eye composite image ML and corrects to make the ghost less visible, corrects the shading of the luminance distribution of the individual eye composite image ML using the luminance distribution information of the overall image M0 of the overall optical system L0, or corrects the seam distribution of the individual eye composite image ML using the image information M0 of the overall optical system L0. Further, the image correction unit 1b performs the distortion correction as necessary.

On the other hand, the output image processing unit 1c outputs the overall image M0 by converting the resolution and improving the image quality using the overall image Z0. The image processing unit 1 has the function of outputting the moving image, the function of outputting the live view, and the function of outputting the still image; therefore, in the output of the still image, the image processing unit 1 performs the image processing for outputting the individual eye composite image ML and in the output of the moving image or the live view, the output image processing unit 1c outputs using the image information of the overall optical system L0.

Figure 4A:
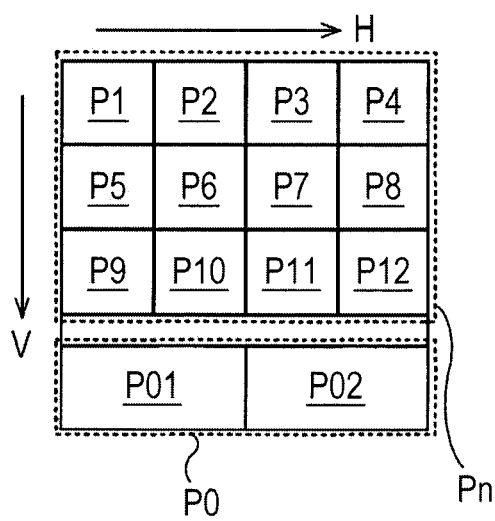
FIG. 4 is a plan view for describing the positional relation between a compound eye optical system and an imaging region in a second embodiment.
Figure 4B:
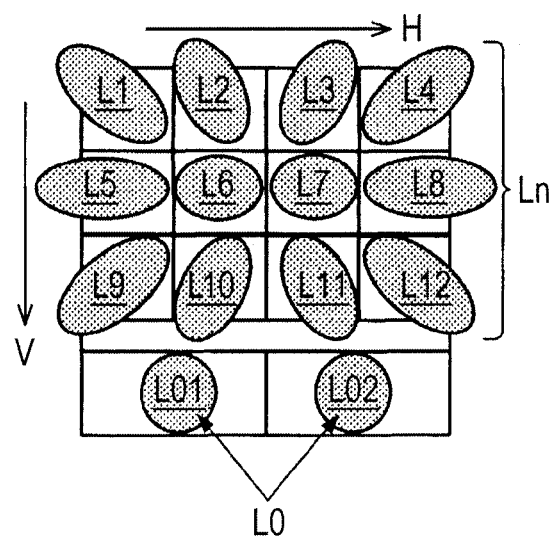

FIG. 4 illustrates the positional relation between the compound eye optical system and the imaging region in the second embodiment in accordance with FIG. 3. Since the field of view is divided into 4×3 in the second embodiment, the individual eye optical systems Ln and the individual eye regions Pn are arranged in the 4×3 array as shown in FIG. 4. The individual eye optical system Ln is not present in the center of the entire individual eye region Pn; therefore, any of the individual eye optical systems Ln is a decentered optical system. Below the individual eye optical systems Ln are provided two lens systems L01 and L02 with the same structure as the overall optical systems L0. Each of the two overall optical systems L01 and L02 is a lens system that forms an image of the entire subject (having an optical axis AX perpendicular to the imaging surface SS), and has a viewing angle four or more times as large as that of one individual eye optical system Ln. In regard to the size of each region, for example, assuming that the imaging surface SS has a pixel number of 16 M pixels, 12 M pixels can be applied to the entire individual eye region Pn and 2 M pixels can be applied to each of the overall region P0. By the use of the overall optical systems L01 and L02, the information of the different parallax with the same viewing angle can be obtained; therefore, the 3-D image output, the distance image output, or the super-resolution image output may be carried out. In this embodiment, 2 M pixels can be applied to each; therefore, the high-definition 3-D moving image can be output.

EXAMPLE

A structure and the like of the compound eye optical system to which the present invention has been applied are more specifically described below with reference to the construction data, etc. Example described here is the numeral example corresponding to the first embodiment described above, and the optical structure diagram (FIG. 2) representing the first embodiment of the compound eye optical system LH illustrates the lens structure, the optical path, etc. of the corresponding numeral example.

Table 1 shows the area arrangement of the individual eye optical systems Ln and the overall optical systems L0 in this example. The individual eye optical systems Ln are arranged in the 5×5 array and the overall optical systems L0 are arranged in three positions. Note that the individual eye optical systems Ln are arranged symmetrically in the horizontal and vertical directions and are illustrated in the nine positions (C, V1, V2, H1, H2, D1, D2, VD, and HD) only.

In the construction data of the overall optical system L0 (position: Zentai) or the individual eye optical systems Ln (position: C) in the rotation symmetry arrangement around the optical axis AX, the plane data are in the order from the left column: plane number, curvature C0 (inverse number of radius of curvature, 1/mm), on-axis plane intervals d (mm), refractive index nd on d line (wavelength: 587.56 nm), and Abbe number vd on d line. In the construction data of the individual eye optical systems Ln as the decentered optical systems (positions: V1, VD, D1, V2, D2, HD, H2, and H1), the plane data are in the order from the left column: plane number, curvature C0 (inverse number of radius of curvature, 1/mm), on-axis plane intervals d (mm), and Y decentering (mm). Note that "90-degree rotation" of the individual eye optical systems Ln means that the state obtained by forming a plane according to the construction data and rotating the plane by 90 degrees around the Z axis corresponds to the state of the lens. Therefore, the decentering direction and the free-form surface coefficient are the same when X and Y are replaced (the H direction corresponds to the X direction, and the V direction corresponds to the Y direction).

The overall optical system L0 (position: Zentai) or the individual eye optical systems Ln (position: C) in the rotation symmetry arrangement around the optical axis AX employs the aspherical surface that is in the rotation symmetry around the optical axis AX, and the aspherical surface is defined by the following formula (AS) using the orthogonal coordinate system (X, Y, Z) whose origin is the plane apex of the aspherical surface. Moreover, the individual eye optical systems Ln as the decentered optical systems (positions: V1, VD, D1, V2, D2, HD, H2, and H1) employ the free-form surface and the free-form surface is defined by the following formula (FS) using the local orthogonal coordinate system (X, Y, Z) whose origin is the plane apex of the free-form surface. The aspherical surface coefficient is shown as the aspherical plane data and the free-form surface coefficient is shown as the free-form surface data (note that $A(j, k)$ is represented by $X^j \cdot Y^k$). The coefficient of the term that is not shown is zero and K=0 is applied to all the aspherical surfaces and K=0 is applied to all the free-form surfaces in both X and Y directions, and $E-n = \times 10^{-n}$ is applied to all the pieces of data.

$$Z = (C0 \cdot h^2)/[1 + \sqrt{1 - (1+K) \cdot C0^2 \cdot h^2}] + \Sigma(Ai \cdot h^i) \quad \text{(AS)}$$

$$Z = (C0 \cdot h^2)/[1 + \sqrt{1 - (1+K) \cdot C0^2 \cdot h^2}] + \Sigma\{A(j, k) \cdot X^j \cdot Y^k\} \quad \text{(FS)}$$

where
h: height perpendicular to Z axis (optical axis AX) ($h^2 = X^2 + Y^2$)
Z: amount of displacement in Z-axis direction at height h position (based on plane apex)
C0: curvature at plane apex (inverse number of radius of curvature)
K: conic constant
Ai: i-th aspherical constant
A(j, k): free-form surface coefficient of j-th of X and k-th of Y Various pieces of data on the imaging unit LU are shown below (FIGS. 1 to 3, etc.)
Fno: approximately 3.2
interval d between individual eye regions Pn=0.2 mm
interval D between individual eye region Pn and overall region P0=2 mm
size of entire individual eye regions Pn: 5.6 mm×4.2 mm
size of each individual eye region Pn: 1.07×0.79 mm
pixel number of each individual eye region Pn: Lb=743×543 pixels (1.12 μm pitch)
size of each overall region P0: 1.43 mm×0.81 mm
pixel number of each overall region P0: 1280×720 pixels
overlapping pixel number of subject: La=40 pixels (subject distance: 2 m)

$La/Lb = 40/743 = 0.054$      condition formula (1)

$La/Lb = 40/543 = 0.074$      condition formula (1)

TABLE 1

| Area arrangement | | | |
|---|---|---|---|
| | V1 | VD | D1 |
| | V2 | D2 | HD |
| | C | H2 | H1 |
| Zentai | Zentai | | Zentai |

Position: C

| Unit: mm | | | | |
|---|---|---|---|---|
| Plane data | | | | |
| Plane number | C0 | d | nd | vd |
| 1 | 1.534928 | 0.215 | 1.5178 | 56.1 |
| 2 | 0 | 0.305 | 1.5100 | 62.4 |

-continued

Unit: mm

| | | | | |
|---|---|---|---|---|
| 3 | 0 | 0.050 | 1.6020 | 28.6 |
| 4 | 0.7509255 | 0.850 | | |
| 5 | −0.354405 | 0.050 | 1.6020 | 28.6 |
| 6 | 0 | 0.300 | 1.5100 | 62.4 |
| 7 | 0 | 0.050 | 1.5178 | 56.1 |
| 8 | 0.5121223 | 0.150 | | |
| 9 | 0 | 0.500 | 1.4714 | 66.02 |
| 10 | 0 | 0.050 | | |

Aspherical surface coefficient
First plane

A4 = 9.314E−03
A6 = 1.905E+00
A8 = −7.387E+00
A10 = 7.279E+00
A12 = 6.976E+01
A14 = 5.992E+01
A16 = −6.976E+02
A18 = 0.000E+00

Aspherical surface coefficient
Fourth plane

A4 = 2.155E−01
A6 = −1.015E+00
A8 = 1.017E+01
A10 = 3.338E+01
A12 = −5.537E+02
A14 = −1.397E+03
A16 = 9.251E+03
A18 = 0.000E+00

Aspherical surface coefficient
Fifth plane

A4 = −1.146E+00
A6 = 6.744E+00
A8 = −6.907E+01
A10 = 2.998E+02
A12 = 3.951E−05
A14 = 3.461E−05
A16 = 3.316E−05
A18 = 0.000E+00

Aspherical surface coefficient
Eighth plane

A4 = −1.468E+00
A6 = 1.973E+01
A8 = −3.199E+02
A10 = 3.147E+03
A12 = −1.691E+04
A14 = 4.276E+04
A16 = −2.996E+04
A18 = 0.000E+00

Position: V1

Unit: mm

Plane data

| Plane number | C0 | d | Y decentering |
|---|---|---|---|
| 1 | 0.9527951 | 0.198 | 0.000 |
| 2 | 0 | 0.305 | 0.044 |
| 3 | 0 | 0.050 | 0.044 |
| 4 | 1.2505431 | 0.826 | 0.077 |
| 5 | 1.3377381 | 0.074 | 0.484 |
| 6 | 0 | 0.300 | 0.484 |
| 7 | 0 | 0.058 | 0.484 |
| 8 | −2.338101 | 0.142 | 0.699 |

-continued

Unit: mm

| | | | |
|---|---|---|---|
| 9 | 0 | 0.500 | 0.890 |
| 10 | 0 | 0.050 | 0.890 |

Free-form surface coefficient
First plane

Y = −3.953E−02, X2 = 2.900E−01, Y2 = 2.953E−01,
X2Y = 5.393E−03, Y3 = 8.977E−03, X4 = 3.088E−01,
X2Y2 = 6.843E−01, Y4 = 2.743E−01, X4Y = 2.576E−02,
X2Y3 = −6.297E−02, Y5 = −1.055E−02, X6 = 5.192E−01,
X4Y2 = 1.088E+00, X2Y4 = 6.341E−01, Y6 = 2.794E−01,
X6Y = 1.828E−01, X4Y3 = −6.036E−01, X2Y5 = 7.031E−02,
Y7 = 5.121E−01, X8 = 3.359E−01, X6Y2 = 3.933E+00,
X4Y4 = 1.816E+01, X2Y6 = 1.070E+01, Y8 = 5.975E−01,
X8Y = 1.097E−02, X6Y3 = 6.167E+00, X4Y5 = 7.030E+00,
X2Y7 = 7.967E−01, Y9 = −5.618E−01, X10 = 3.461E+00,
X8Y2 = 1.459E+01, X6Y4 = −4.572E+01, X4Y6 = −7.086E+01,
X2Y8 = −2.802E+01

Free-form surface coefficient
Fourth plane

Y = −5.516E−03, X2 = −1.491E−01, Y2 = −1.735E−01,
X2Y = 3.365E−01, Y3 = 4.063E−01, X4 = 2.486E−01,
X2Y2 = 9.696E−01, Y4 = 3.255E−01, X4Y = 8.729E−01,
X2Y3 = 1.784E+00, Y5 = 9.510E−01, X6 = 3.980E+00,
X4Y2 = 1.188E+01, X2Y4 = 1.168E+01, Y6 = 4.123E+00,
X6Y = 7.692E+00, X4Y3 = 3.888E+00, X2Y5 = 8.452E+00,
Y7 = 1.886E+00, X8 = −3.478E+01, X6Y2 = −1.315E+02,
X4Y4 = −2.233E+02, X2Y6 = −1.491E+02, Y8 = −4.374E+01,
X8Y = 4.733E+00, X6Y3 = 1.695E+02, X4Y5 = 2.768E+02,
X2Y7 = 1.064E+02, Y9 = 3.424E+01, X10 = 2.197E+02,
X8Y2 = 1.099E+03, X6Y4 = 2.487E+03, X4Y6 = 2.746E+03,
X2Y8 = 1.312E+03, Y10 = 2.927E+02

Free-form surface coefficient
Fifth plane

Y = 2.497E−02, X2 = −2.321E−01, Y2 = −5.041E−01,
X2Y = −6.330E−01, Y3 = −1.621E−01, X4 = −1.808E+00,
X2Y2 = −1.465E+00, Y4 = −1.278E+00, X4Y = 2.683E−01,
X2Y3 = 2.795E+00, Y5 = 2.758E−01, X6 = 5.808E+00,
X4Y2 = 7.502E−01, X2Y4 = 8.454E+00, Y6 = 1.011E+01,
X6Y = 2.889E+00, X4Y3 = 4.274E+00, X2Y5 = −3.082E+00,
Y7 = 2.278E+01, X8 = −5.127E+01, X6Y2 = −1.478E+01,
X4Y4 = 6.967E+01, X2Y6 = −1.326E+02, Y8 = −8.045E+01,
X8Y = 4.752E+01, X6Y3 = 7.582E+01, X4Y5 = 8.368E+01,
X2Y7 = 1.474E+02, Y9 = −6.233E+01, X10 = 1.544E+02,
X8Y2 = 7.403E+01, X6Y4 = −6.087E+02, X4Y6 = −1.080E+02,
X2Y8 = 2.065E+02, Y10 = 8.294E+01

Free-form surface coefficient
Eighth plane

Y = 1.224E−01, X2 = 2.075E+00, Y2 = 1.383E+00,
X2Y = −1.512E+00, Y3 = −7.844E−01, X4 = −1.540E+00,
X2Y2 = 3.547E+00, Y4 = 1.814E+00, X4Y = 1.920E+00,
X2Y3 = 4.295E+00, Y5 = 7.072E+00, X6 = 3.319E+01,
X4Y2 = 8.159E+01, X2Y4 = 1.309E+01, Y6 = 2.509E+01,
X6Y = −2.759E+01, X4Y3 = 1.380E+01, X2Y5 = −7.415E+01,
Y7 = 2.341E+01, X8 = −2.258E+02, X6Y2 = −8.530E+02,
X4Y4 = −6.766E+02, X2Y6 = 9.905E+00, Y8 = −2.225E+02,
X8Y = 1.344E+02, X6Y3 = 1.638E+02, X4Y5 = 1.627E+02,
X2Y7 = 8.391E+02, Y9 = −1.233E+03, X10 = 1.038E+03,
X8Y2 = 4.350E+03, X6Y4 = 7.412E+03, X4Y6 = 5.571E+03,
X2Y8 = 1.823E+03, Y10 = −1.666E+03

Position: V2

Unit: mm

Plane data

| Plane number | C0 | d | Y decentering |
|---|---|---|---|
| 1 | 1.0937088 | 0.228 | 0.000 |
| 2 | 0 | 0.305 | 0.011 |
| 3 | 0 | 0.065 | 0.011 |

-continued

Unit: mm

| | | | |
|---|---|---|---|
| 4 | 1.2847229 | 0.764 | 0.022 |
| 5 | 0.5588239 | 0.119 | 0.210 |
| 6 | 0 | 0.300 | 0.210 |
| 7 | 0 | 0.050 | 0.210 |
| 8 | −2.429775 | 0.150 | 0.338 |
| 9 | 0 | 0.500 | 0.445 |
| 10 | 0 | 0.050 | 0.445 |

Free-form surface coefficient
First plane $Y = -2.084\text{E}-02$, $X2 = 2.206\text{E}-01$, $Y2 = 2.262\text{E}-01$,
$X2Y = -6.550\text{E}-02$, $Y3 = -1.305\text{E}-02$, $X4 = 2.369\text{E}-01$,
$X2Y2 = 6.352\text{E}-01$, $Y4 = 2.219\text{E}-01$, $X4Y = -7.399\text{E}-03$,
$X2Y3 = -1.586\text{E}-02$, $Y5 = 6.438\text{E}-04$, $X6 = 9.268\text{E}-02$,
$X4Y2 = 4.614\text{E}-01$, $X2Y4 = 9.744\text{E}-01$, $Y6 = 3.951\text{E}-01$,
$X6Y = -2.694\text{E}-01$, $X4Y3 = -7.160\text{E}-01$, $X2Y5 = -2.124\text{E}-01$,
$Y7 = 4.055\text{E}-01$, $X8 = 1.929\text{E}+00$, $X6Y2 = 8.739\text{E}+00$,
$X4Y4 = 1.386\text{E}+01$, $X2Y6 = 6.597\text{E}+00$, $Y8 = 1.099\text{E}+00$,
$X8Y = 5.560\text{E}-02$, $X6Y3 = 2.631\text{E}-01$, $X4Y5 = 3.563\text{E}+00$,
$X2Y7 = 9.587\text{E}-01$, $Y9 = 6.218\text{E}-02$, $X10 = 1.823\text{E}-01$,
$X8Y2 = 2.736\text{E}+00$, $X6Y4 = 4.164\text{E}+00$, $X4Y6 = 3.366\text{E}+00$,
$X2Y8 = -1.746\text{E}+00$, $Y10 = -3.665\text{E}-02$ Free-form surface coefficient
Fourth plane $Y = -1.011\text{E}-01$, $X2 = -1.456\text{E}-01$, $Y2 = -2.008\text{E}-01$,
$X2Y = -1.783\text{E}-01$, $Y3 = 1.011\text{E}-01$, $X4 = 3.027\text{E}-01$,
$X2Y2 = 1.578\text{E}+00$, $Y4 = 4.006\text{E}-01$, $X4Y = 6.951\text{E}-01$,
$X2Y3 = 1.078\text{E}+00$, $Y5 = 5.638\text{E}-01$, $X6 = -4.986\text{E}-01$,
$X4Y2 = -6.200\text{E}+00$, $X2Y4 = -8.856\text{E}+00$, $Y6 = -3.808\text{E}+00$,
$X6Y = -8.530\text{E}+00$, $X4Y3 = -2.013\text{E}+01$, $X2Y5 = -3.285\text{E}+00$,
$Y7 = 1.847\text{E}+00$, $X8 = 1.750\text{E}+01$, $X6Y2 = 1.164\text{E}+02$,
$X4Y4 = 2.235\text{E}+02$, $X2Y6 = 1.354\text{E}+02$, $Y8 = 3.227\text{E}+01$,
$X8Y = 1.458\text{E}+01$, $X6Y3 = 2.008\text{E}+01$, $X4Y5 = 7.803\text{E}+01$,
$X2Y7 = 1.545\text{E}+00$, $Y9 = 2.166\text{E}+00$, $X10 = 2.547\text{E}+00$,
$X8Y2 = 7.595\text{E}+01$, $X6Y4 = 1.214\text{E}+02$, $X4Y6 = 1.801\text{E}+02$,
$X2Y8 = 3.141\text{E}+01$, $Y10 = 4.010\text{E}+00$ Free-form surface coefficient
Fifth plane $Y = -1.687\text{E}-01$, $X2 = 1.535\text{E}-01$, $Y2 = -1.860\text{E}-01$,
$X2Y = -9.135\text{E}-01$, $Y3 = -4.695\text{E}-01$, $X4 = -1.810\text{E}+00$,
$X2Y2 = -1.126\text{E}+00$, $Y4 = -2.371\text{E}+00$, $X4Y = -1.979\text{E}-02$,
$X2Y3 = 1.917\text{E}+00$, $Y5 = -6.368\text{E}-01$, $X6 = 5.304\text{E}+00$,
$X4Y2 = 7.163\text{E}+00$, $X2Y4 = -1.325\text{E}+00$, $Y6 = 1.064\text{E}+01$,
$X6Y = 1.209\text{E}+00$, $X4Y3 = -8.162\text{E}+00$, $X2Y5 = -1.824\text{E}+01$,
$Y7 = 2.992\text{E}+01$, $X8 = -4.385\text{E}+01$, $X6Y2 = -5.348\text{E}+01$,
$X4Y4 = 7.966\text{E}+01$, $X2Y6 = -9.465\text{E}+01$, $Y8 = -1.803\text{E}+02$,
$X8Y = 5.740\text{E}+00$, $X6Y3 = 2.414\text{E}+01$, $X4Y5 = 2.081\text{E}+02$,
$X2Y7 = 1.190\text{E}+01$, $Y9 = -2.409\text{E}+02$, $X10 = 1.338\text{E}+02$,
$X8Y2 = -4.378\text{E}+01$, $X6Y4 = -4.346\text{E}+02$, $X4Y6 = -1.124\text{E}+01$,
$X2Y8 = 3.977\text{E}+02$, $Y10 = 7.657\text{E}+02$ Free-form surface coefficient
Eighth plane $Y = 1.089\text{E}-02$, $X2 = 2.288\text{E}+00$, $Y2 = 1.653\text{E}+00$,
$X2Y = -1.653\text{E}+00$, $Y3 = -1.171\text{E}+00$, $X4 = -1.421\text{E}+00$,
$X2Y2 = 3.507\text{E}+00$, $Y4 = -8.067\text{E}-01$, $X4Y = 1.342\text{E}+00$,
$X2Y3 = 5.001\text{E}+00$, $Y5 = 5.026\text{E}+00$, $X6 = 2.139\text{E}+01$,
$X4Y2 = 8.740\text{E}+01$, $X2Y4 = 3.560\text{E}+01$, $Y6 = 2.333\text{E}+01$,
$X6Y = 1.126\text{E}+01$, $X4Y3 = -3.083\text{E}+01$, $X2Y5 = -4.244\text{E}+01$,
$Y7 = 1.486\text{E}+01$, $X8 = -1.213\text{E}+02$, $X6Y2 = -8.605\text{E}+02$,
$X4Y4 = -8.703\text{E}+02$, $X2Y6 = -3.927\text{E}+02$, $Y8 = -1.100\text{E}+02$,
$X8Y = -1.495\text{E}+02$, $X6Y3 = 2.230\text{E}+02$, $X4Y5 = 1.423\text{E}+02$,
$X2Y7 = -8.262\text{E}+01$, $Y9 = -1.953\text{E}+02$, $X10 = 1.040\text{E}+03$,
$X8Y2 = 4.701\text{E}+03$, $X6Y4 = 1.042\text{E}+04$, $X4Y6 = 8.246\text{E}+03$,
$X2Y8 = 2.386\text{E}+03$, $Y10 = 4.922\text{E}+02$ Position: H1 (90-Degree Rotation)

Unit: mm

Plane data

| Plane number | C0 | d | Y decentering |
|---|---|---|---|
| 1 | 1.0256853 | 0.132 | 0.000 |
| 2 | 0 | 0.305 | 0.034 |
| 3 | 0 | 0.050 | 0.034 |
| 4 | 1.1274901 | 0.849 | 0.058 |
| 5 | 1.1551341 | 0.051 | 0.660 |
| 6 | 0 | 0.300 | 0.660 |
| 7 | 0 | 0.075 | 0.660 |
| 8 | −2.401183 | 0.124 | 0.917 |
| 9 | 0 | 0.500 | 1.177 |
| 10 | 0 | 0.050 | 1.177 |

Free-form surface coefficient
First plane $X2 = 1.878\text{E}-01$, $Y2 = 2.560\text{E}-01$, $X2Y = 9.398\text{E}-02$,
$Y3 = 2.422\text{E}-02$, $X4 = 1.978\text{E}-01$, $X2Y2 = 5.271\text{E}-01$,
$Y4 = 2.698\text{E}-01$, $X4Y = 1.753\text{E}-01$, $X2Y3 = -1.102\text{E}-01$,
$Y5 = -8.201\text{E}-02$, $X6 = 4.932\text{E}-01$, $X4Y2 = 2.524\text{E}+00$,
$X2Y4 = 2.328\text{E}+00$, $Y6 = 5.979\text{E}-01$, $X6Y = 9.838\text{E}-01$,
$X4Y3 = 2.382\text{E}+00$, $X2Y5 = 2.254\text{E}+00$, $Y7 = 7.306\text{E}-01$,
$X8 = -1.251\text{E}+00$, $X6Y2 = -1.299\text{E}+01$, $X4Y4 = -6.919\text{E}+00$,
$X2Y6 = -4.075\text{E}-01$, $Y8 = 6.251\text{E}-01$, $X8Y = -2.588\text{E}-01$,
$X6Y3 = -1.171\text{E}+01$, $X4Y5 = -5.330\text{E}+00$, $X2Y7 = -1.499\text{E}+01$,
$Y9 = -3.378\text{E}+00$, $X10 = 5.547\text{E}+00$, $X8Y2 = 8.282\text{E}+01$,
$X6Y4 = 1.051\text{E}+02$, $X4Y6 = 3.272\text{E}+01$, $X2Y8 = 1.390\text{E}+01$,
$Y10 = 4.288\text{E}+00$ Free-form surface coefficient
Fourth plane $Y = -1.836\text{E}-02$, $X2 = -2.282\text{E}-01$, $Y2 = -1.040\text{E}-01$,
$X2Y = 3.345\text{E}-01$, $Y3 = 3.166\text{E}-01$, $X4 = 1.474\text{E}-01$,
$X2Y2 = 1.166\text{E}+00$, $Y4 = 5.338\text{E}-01$, $X4Y = 1.013\text{E}+00$,
$X2Y3 = 1.265\text{E}+00$, $Y5 = 1.009\text{E}+00$, $X6 = 7.702\text{E}-01$,
$X4Y2 = 1.564\text{E}+00$, $X2Y4 = 3.430\text{E}+00$, $Y6 = 2.153\text{E}+00$,
$X6Y = -8.666\text{E}-01$, $X4Y3 = 2.318\text{E}+01$, $X2Y5 = -2.224\text{E}+01$,
$Y7 = -1.371\text{E}+01$, $X8 = -9.248\text{E}+00$, $X6Y2 = 4.404\text{E}+01$,
$X4Y4 = -7.762\text{E}+01$, $X2Y6 = 9.306\text{E}+01$, $Y8 = 2.650\text{E}+01$,
$X8Y = 4.393\text{E}+01$, $X6Y3 = -2.438\text{E}+02$, $X4Y5 = 4.339\text{E}+02$,
$X2Y7 = 1.837\text{E}+02$, $Y9 = 3.982\text{E}+01$, $X10 = 6.973\text{E}+01$,
$X8Y2 = 1.279\text{E}+02$, $X6Y4 = 1.188\text{E}+03$, $X4Y6 = 1.773\text{E}+02$,
$X2Y8 = -1.636\text{E}+02$, $Y10 = 2.876\text{E}+01$ Free-form surface coefficient
Fifth plane $Y = 1.531\text{E}-02$, $X2 = -3.014\text{E}-01$, $Y2 = -4.919\text{E}-01$,
$X2Y = -1.137\text{E}+00$, $Y3 = -7.095\text{E}-01$, $X4 = -1.872\text{E}+00$,
$X2Y2 = -1.305\text{E}+00$, $Y4 = -6.717\text{E}-01$, $X4Y = -4.863\text{E}-01$,
$X2Y3 = 1.200\text{E}-01$, $Y5 = 3.202\text{E}+00$, $X6 = 9.609\text{E}+00$,
$X4Y2 = 8.498\text{E}+00$, $X2Y4 = 1.721\text{E}+00$, $Y6 = 1.322\text{E}+01$,
$X6Y = 6.642\text{E}+00$, $X4Y3 = 3.781\text{E}+01$, $X2Y5 = 4.661\text{E}+01$,
$Y7 = -3.295\text{E}+00$, $X8 = -1.542\text{E}+02$, $X6Y2 = -1.858\text{E}+02$,
$X4Y4 = -5.229\text{E}+01$, $X2Y6 = -1.536\text{E}+02$, $Y8 = -1.130\text{E}+02$,
$X8Y = -1.576\text{E}+02$, $X6Y3 = 4.519\text{E}+01$, $X4Y5 = -1.965\text{E}+02$,
$X2Y7 = -1.658\text{E}+02$, $Y9 = -2.307\text{E}+01$, $X10 = 1.487\text{E}+02$,
$X8Y2 = -3.987\text{E}+01$, $X6Y4 = 1.859\text{E}+03$, $X4Y6 = 1.167\text{E}+02$,
$X2Y8 = 5.062\text{E}+02$, $Y10 = 3.840\text{E}+02$ Free-form surface coefficient
Eighth plane $Y = 6.015\text{E}-02$, $X2 = 1.902\text{E}+00$, $Y2 = 1.119\text{E}+00$,
$X2Y = -2.154\text{E}+00$, $Y3 = -9.440\text{E}-01$, $X4 = -9.126\text{E}-01$,
$X2Y2 = 3.146\text{E}+00$, $Y4 = 2.758\text{E}+00$, $X4Y = 1.115\text{E}+01$,
$X2Y3 = -1.215\text{E}+00$, $Y5 = 4.054\text{E}+00$, $X6 = 4.356\text{E}+01$,
$X4Y2 = 7.900\text{E}+01$, $X2Y4 = 9.156\text{E}+01$, $Y6 = 2.336\text{E}+01$,
$X6Y = -2.496\text{E}+02$, $X4Y3 = -1.205\text{E}+02$, $X2Y5 = 4.169\text{E}+01$,
$Y7 = -4.605\text{E}+00$, $X8 = -3.491\text{E}+02$, $X6Y2 = -3.246\text{E}+02$,
$X4Y4 = -1.386\text{E}+03$, $X2Y6 = -6.821\text{E}+02$, $Y8 = -1.972\text{E}+02$,
$X8Y = 1.558\text{E}+03$, $X6Y3 = 2.074\text{E}+03$, $X4Y5 = 1.703\text{E}+02$,
$X2Y7 = -1.205\text{E}+02$, $Y9 = -1.067\text{E}+02$, $X10 = -1.134\text{E}+03$,
$X8Y2 = -1.074\text{E}+03$, $X6Y4 = 9.524\text{E}+02$, $X4Y6 = 1.099\text{E}+04$,
$X2Y8 = 3.821\text{E}+03$, $Y10 = 7.545\text{E}+02$ Position: H2 (90-Degree Rotation)

Unit: mm

Plane data

| Plane number | C0 | d | Y decentering |
|---|---|---|---|
| 1 | 0.8961863 | 0.246 | 0.000 |
| 2 | 0 | 0.305 | 0.018 |
| 3 | 0 | 0.050 | 0.018 |
| 4 | 1.2800572 | 0.789 | 0.033 |
| 5 | 1.204035 | 0.111 | 0.376 |
| 6 | 0 | 0.300 | 0.376 |
| 7 | 0 | 0.055 | 0.376 |
| 8 | −2.297383 | 0.145 | 0.526 |
| 9 | 0 | 0.500 | 0.651 |
| 10 | 0 | 0.050 | 0.651 |

Free-form surface coefficient
First plane

Y = −5.078E−02, X2 = 3.242E−01, Y2 = 3.152E−01,
X2Y = −5.128E−02, Y3 = −2.492E−02, X4 = 3.496E−01,
X2Y2 = 7.231E−01, Y4 = 2.838E−01, X4Y = −1.471E−01,
X2Y3 = −4.139E−01, Y5 = −8.938E−02, X6 = 2.285E−01,
X4Y2 = 8.105E−01, X2Y4 = 1.082E+00, Y6 = 3.792E−01,
X6Y = 2.305E−01, X4Y3 = 1.410E+00, X2Y5 = 2.366E+00,
Y7 = 4.282E−01, X8 = 2.297E+00, X6Y2 = 8.788E+00,
X4Y4 = 1.054E+01, X2Y6 = 3.929E+00, Y8 = 3.931E−01,
X8Y = −1.503E+00, X6Y3 = −7.644E+00, X4Y5 = −1.384E+01,
X2Y7 = −9.618E+00, Y9 = −1.470E−01, X10 = −4.389E−01,
X8Y2 = −2.649E+00, X6Y4 = −7.282E+00, X4Y6 = 4.790E+00,
X2Y8 = 3.937E−01, Y10 = −8.379E−01
Free-form surface coefficient
Fourth plane X2 = −1.385E−01, Y2 = −2.145E−01, X2Y = 6.643E−02,
Y3 = 2.117E−01, X4 = 3.946E−01, X2Y2 = 1.001E+00,
Y4 = 2.801E−01, X4Y = 7.592E−01, X2Y3 = 1.765E+01,
Y5 = 1.113E+00, X6 = 1.566E+00, X4Y2 = 3.966E+00,
X2Y4 = 8.273E−03, Y6 = −2.182E+00, X6Y = −6.261E+00,
X4Y3 = −9.409E+00, X2Y5 = −9.576E+00, Y7 = −5.572E−01,
X8 = 1.843E+00, X6Y2 = −6.612E+00, X4Y4 = −2.118E+01,
X2Y6 = 2.937E+01, Y8 = 1.466E+01, X8Y = 4.782E+01,
X6Y3 = 9.962E+01, X4Y5 = 5.797E+01, X2Y7 = 1.020E+02,
Y9 = 6.326E+00, X10 = 6.155E+01, X8Y2 = 3.681E+02,
X6Y4 = 1.017E+03, X4Y6 = 9.708E+02, X2Y8 = 7.952E+01,
Y10 = 2.287E+01, BDX = 1.000E+00
Free-form surface coefficient
Fifth plane Y = 9.872E−02, X2 = −1.838E−01, Y2 = −3.341E−01,
X2Y = −3.853E−01, Y3 = −4.275E−02, X4 = −1.458E+00,
X2Y2 = −1.521E+00, Y4 = −1.517E+00, X4Y = 6.682E−01,
X2Y3 = 3.317E+00, Y5 = −3.804E−01, X6 = 2.783E+00,
X4Y2 = 2.728E+00, X2Y4 = 1.922E+00, Y6 = 1.215E+01,
X6Y = −5.489E+00, X4Y3 = −1.749E+01, X2Y5 = −3.003E+01,
Y7 = 2.860E+01, X8 = −1.607E+01, X6Y2 = −3.411E+01,
X4Y4 = 1.109E+02, X2Y6 = −4.523E+01, Y8 = −1.373E+02,
X8Y = 5.569E+01, X6Y3 = 1.623E+02, X4Y5 = 2.493E+02,
X2Y7 = 2.063E+02, Y9 = −1.485E+02, X10 = 3.485E+01,
X8Y2 = 1.137E+02, X6Y4 = −7.481E+02, X4Y6 = −3.289E+02,
X2Y8 = −1.856E+01, Y10 = 4.989E+02
Free-form surface coefficient
Eighth plane Y = 1.349E−01, X2 = 2.101E+00, Y2 = 1.667E+00,
X2Y = −1.239E+00, Y3 = −9.641E−01, X4 = −1.628E+00,
X2Y2 = 1.335E+00, Y4 = 2.472E−02, X4Y = 1.902E+00,
X2Y3 = 5.411E+00, Y5 = 8.720E+00, X6 = 3.139E+01,
X4Y2 = 9.677E+01, X2Y4 = 3.421E+01, Y6 = 2.752E+01,
X6Y = −1.739E+01, X4Y3 = −1.590E+01, X2Y5 = −7.306E+01,
Y7 = −5.877E+01, X8 = −2.290E+02, X6Y2 = −9.219E+02,
X4Y4 = −8.638E+02, X2Y6 = −2.809E+02, Y8 = −2.947E+02,
X8Y = 1.932E+01, X6Y3 = 2.877E+02, X4Y5 = 3.685E+02,
X2Y7 = 3.789E+02, Y9 = −1.345E+02, X10 = 1.109E+03, -continued Unit: mm X8Y2 = 3.995E+03, X6Y4 = 7.643E+03, X4Y6 = 6.428E+03,
X2Y8 = 1.763E+03, XY9 = −1.026E−03, Y10 = 3.982E+02, Position: VD (90-Degree Rotation)

Unit: mm

Plane data

| Plane number | C0 | d | Y decentering | X decentering |
|---|---|---|---|---|
| 1 | −0.266211 | 0.229 | 0.000 | 0.000 |
| 2 | 0 | 0.305 | 0.042 | 0.055 |
| 3 | 0 | 0.050 | 0.042 | 0.055 |
| 4 | 2.4669029 | 0.836 | 0.084 | 0.113 |
| 5 | 2.6744631 | 0.064 | 0.350 | 0.420 |
| 6 | 0 | 0.300 | 0.350 | 0.420 |
| 7 | 0 | 0.051 | 0.350 | 0.420 |
| 8 | −2.436125 | 0.149 | 0.458 | 0.631 |
| 9 | 0 | 0.500 | 0.598 | 0.826 |
| 10 | 0 | 0.050 | 0.598 | 0.826 |

Free-form surface coefficient
First plane

X = 1.375E−02, Y = −5.534E−02, X2 = 7.099E−01,
XY = 1.694E−02, Y2 = 7.242E−01, X3 = 6.264E−02,
X2Y = 1.600E−01, XY2 = 7.898E−02, Y3 = 4.048E−02,
X4 = 1.819E−01, X3Y = −1.005E−01, X2Y2 = 2.315E−01,
XY3 = 1.246E−02, Y4 = 1.429E−01, X5 = 1.162E−01,
X4Y = 2.835E−01, X3Y2 = 1.557E−01, X2Y3 = 3.915E−01,
XY4 = 4.989E−02, Y5 = 1.281E−01, X6 = 2.824E−01,
X5Y = 8.154E−02, X4Y2 = 3.890E−01, X3Y3 = 3.163E−02,
X2Y4 = −9.571E−02, XY5 = 1.295E−01, Y6 = −1.917E−01,
X7 = 2.419E−01, X6Y = 4.144E−01, X5Y2 = 1.171E+00,
X4Y3 = 8.294E−01, X3Y4 = 1.162E+00, X2Y5 = 1.147E+00,
XY6 = 4.459E−01, Y7 = 4.269E−01, X8 = 1.221E−02,
X7Y = −1.301E+00, X6Y2 = −7.667E−01, X5Y3 = −1.401E+00,
X4Y4 = 4.267E−01, X3Y5 = −1.677E+00, X2Y6 = 8.698E−01,
XY7 = −4.053E−01, Y8 = 5.050E−01
Free-form surface coefficient
Fourth plane X = −4.899E−03, Y = −2.729E−02, X2 = −1.031E+00,
XY = 4.676E−02, Y2 = −1.009E+00, X3 = 2.586E−01,
X2Y = 6.027E−01, XY2 = 3.057E−01, Y3 = 2.613E−01,
X4 = −1.501E+00, X3Y = 3.976E−01, X2Y2 = −3.296E+00,
XY3 = 5.853E−01, Y4 = −1.870E+00, X5 = 3.919E−01,
X4Y = 4.691E−01, X3Y2 = 4.830E−01, X2Y3 = 8.431E−01,
XY4 = 3.906E−01, Y5 = 3.248E−01, X6 = −1.516E+00,
X5Y = 2.955E−01, X4Y2 = −5.904E+00, X3Y3 = −1.422E+00,
X2Y4 = −5.865E+00, XY5 = −5.575E−01, Y6 = −1.026E+00,
X7 = 5.910E+00, X6Y = 1.246E+01, X5Y2 = 1.817E+01,
X4Y3 = 1.926E+01, X3Y4 = 1.629E+01, X2Y5 = 1.444E+01,
XY6 = 4.713E+00, Y7 = 2.684E+00, X8 = −4.966E+01,
X7Y = 1.958E+01, X6Y2 = −2.067E+02, X5Y3 = 7.242E+01,
X4Y4 = −3.189E+02, X3Y5 = 5.889E+01, X2Y6 = −2.357E+02,
XY7 = 1.700E+01, Y8 = −6.746E+01
Free-form surface coefficient
Fifth plane X = −9.377E−02, Y = −3.666E−02, X2 = −1.600E+00,
XY = −3.212E−01, Y2 = −1.120E+00, X3 = −1.435E+00,
X2Y = 2.684E−01, XY2 = −1.009E+00, Y3 = −4.916E−01,
X4 = −2.793E+00, X3Y = 1.634E+00, X2Y2 = −5.274E+00,
XY3 = 1.204E+00, Y4 = −3.730E+00, X5 = −6.266E+00,
X4Y = 1.955E+00, X3Y2 = 3.720E+00, X2Y3 = 6.396E+00,
XY4 = −5.747E−01, Y5 = −1.104E−01, X6 = −3.591E+01,
X5Y = −3.426E+01, X4Y2 = −1.036E+02, X3Y3 = 5.339E+00,
X2Y4 = −1.146E+02, XY5 = 1.423E+01, Y6 = −1.257E+01,
X7 = 9.898E+01, X6Y = 5.286E+01, X5Y2 = −1.634E+02,
X4Y3 = −6.610E+00, X3Y4 = −1.399E+02, X2Y5 = −5.663E+01,
XY6 = −1.982E+00, Y7 = 1.376E+01, X8 = 2.603E+02,
X7Y = 7.246E+02, X6Y2 = 1.257E+03, X5Y3 = 6.147E+02,
X4Y4 = 2.040E+03, X3Y5 = −2.834E+02, X2Y6 = 1.477E+03, -continued Unit: mm XY7 = −2.169E+02, Y8 = 4.546E+01, X9 = −2.940E+02,
X8Y = 4.605E+02, X7Y2 = 1.796E+03, X6Y3 = −2.795E+02,
X5Y4 = 2.395E+03, X4Y5 = 7.214E+02, X3Y6 = 7.905E+02,
X2Y7 = 4.812E+02, XY8 = 6.343E+01, Y9 = −1.217E+02,
X10 = 1.099E+03, X9Y = −6.552E+03, X8Y2 = −9.861E+03,
X7Y3 = −5.314E+03, X6Y4 = −1.874E+04, X5Y5 = −2.739E+03,
X4Y6 = −2.349E+04, X3Y7 = 3.458E+03, X2Y8 = −1.151E+04,
XY9 = 1.035E+03, Y10 = −1.245E+03
Free-form surface coefficient
Eighth plane X = 2.319E−02, Y = −3.883E−02, X2 = 1.082E+00,
XY = −5.916E−01, Y2 = 1.898E+00, X3 = −1.148E+00,
X2Y = 4.250E−01, XY2 = −8.305E−01, Y3 = −8.039E−01,
X4 = 1.958E−01, X3Y = 7.084E−01, X2Y2 = 7.607E−01,
XY3 = 3.926E+00, Y4 = −7.230E−01, X5 = −2.540E+00,
X4Y = −2.536E+00, X3Y2 = 3.753E+00, X2Y3 = 1.820E−01,
XY4 = −5.276E+00, Y5 = 1.820E+00, X6 = 5.354E+01,
X5Y = −3.426E+01, X4Y2 = 1.130E+02, X3Y3 = −1.816E+01,
X2Y4 = 1.022E+02, XY5 = −2.632E+01, Y6 = 2.764E+01,
X7 = 1.322E+02, X6Y = 6.265E+01, X5Y2 = −2.159E+02,
X4Y3 = −5.115E+00, X3Y4 = 9.243E+00, X2Y5 = 1.479E+00,
XY6 = −2.034E−01, Y7 = −2.813E+01, X8 = −1.643E+02,
X7Y = 9.771E+02, X6Y2 = −1.964E+03, X5Y3 = 2.911E+02,
X4Y4 = −1.665E+03, X3Y5 = 1.221E+03, X2Y6 = −1.126E+03,
XY7 = 3.180E+02, Y8 = −2.300E+01, X9 = −8.717E+02,
X8Y = −6.154E+02, X7Y2 = 2.102E+03, X6Y3 = 1.094E+03,
X5Y4 = 6.049E+02, X4Y5 = −2.400E+02, X3Y6 = −1.481E+02,
X2Y7 = 8.528E+01, XY8 = 2.831E+02, Y9 = 1.879E+02,
X10 = 1.613E+02, X9Y = −9.666E+03, X8Y2 = 1.775E+04,
X7Y3 = −7.887E+02, X6Y4 = 1.528E+04, X5Y5 = −5.540E+02,
X4Y6 = 1.419E+04, X3Y7 = −4.282E+02, X2Y8 = 6.457E+03,
XY9 = −1.717E+03, Y10 = −6.457E+02

Position: HD (90-Degree Rotation)

Unit: mm

Plane data

| Plane number | C0 | d | Y decentering | X decentering |
|---|---|---|---|---|
| 1 | 1.0415235 | 0.126 | 0.000 | 0.000 |
| 2 | 0 | 0.305 | 0.070 | 0.026 |
| 3 | 0 | 0.050 | 0.070 | 0.026 |
| 4 | 2.7137362 | 0.824 | 0.131 | 0.058 |
| 5 | 1.8378488 | 0.076 | 0.637 | 0.250 |
| 6 | 0 | 0.300 | 0.637 | 0.250 |
| 7 | 0 | 0.077 | 0.637 | 0.250 |
| 8 | −2.419797 | 0.122 | 0.937 | 0.321 |
| 9 | 0 | 0.500 | 1.224 | 0.449 |
| 10 | 0 | 0.050 | 1.224 | 0.449 |

Free-form surface coefficient
First plane

X = −5.185E−02, Y = −5.740E−02, X2 = 1.564E−01,
XY = 3.343E−04, Y2 = 2.398E−01, X3 = 3.315E−03,
X2Y = 6.227E−03, XY2 = −2.085E−02, Y3 = −2.702E−03,
X4 = 6.977E−02, X3Y = −1.256E−03, X2Y2 = 4.834E−01,
XY3 = −8.799E−02, Y4 = 2.128E−01, X5 = 1.500E−01,
X4Y = 1.049E−01, X3Y2 = −7.849E−02, X2Y3 = −2.823E−02,
XY4 = −6.626E−02, Y5 = 4.489E−03, X6 = 3.434E−01,
X5Y = −1.540E−01, X4Y2 = 8.976E−01, X3Y3 = −7.423E−01,
X2Y4 = 1.798E+00, XY5 = −5.831E−01, Y6 = 5.972E−01,
X7 = 5.605E−01, X6Y = −2.909E−01, X5Y2 = 1.293E+00,
X4Y3 = 5.382E−01, X3Y4 = −8.709E−01, X2Y5 = −1.086E+00,
XY6 = 1.269E+00, Y7 = −2.145E−01, X8 = −7.711E−01,
X7Y = −3.084E+00, X6Y2 = −2.073E+01, X5Y3 = −8.402E+00,
X4Y4 = −5.062E+01, X3Y5 = 8.011E+00, X2Y6 = −2.683E+01,
XY7 = −1.805E+00, Y8 = −2.439E+01, X9 = 2.249E+01,
X8Y = 6.271E+00, X7Y2 = −1.184E+01, X6Y3 = −5.306E+01,
X5Y4 = 1.103E+01, X4Y5 = −1.338E+01, X3Y6 = 1.341E+01,
X2Y7 = 4.624E+01, XY8 = −6.880E+00, Y9 = 6.965E+00,
X10 = −1.647E+01, X9Y = 1.264E+01, X8Y2 = 1.869E+02,
X7Y3 = 1.260E+02, X6Y4 = 7.111E+02, X5Y5 = −2.391E+00,
X4Y6 = 5.976E+02, X3Y7 = −4.830E+01, X2Y8 = 1.480E+02,
XY9 = 3.442E+01, Y10 = 3.118E+00
Free-form surface coefficient
Fourth plane Y = −1.680E−02, X2 = −1.025E+00, XY = 4.119E−02,
Y2 = −8.690E−01, X3 = 1.640E−01, X2Y = 3.402E−01,
XY2 = 1.915E−01, Y3 = 5.069E−01, X4 = −2.446E+00,
X3Y = 2.340E−01, X2Y2 = −3.681E+00, XY3 = −1.642E−02,
Y4 = −1.730E+00, X5 = 6.306E−01, X4Y = 2.426E+00,
X3Y2 = 4.623E−01, X2Y3 = 2.580E+00, XY4 = −7.551E−02,
Y5 = 6.180E−01, X6 = −4.787E+00, X5Y = 7.592E−01,
X4Y2 = −2.453E+01, X3Y3 = 2.788E+00, X2Y4 = −2.626E+01,
XY5 = −1.114E+00, Y6 = −8.271E+00, X7 = 1.080E+00,
X6Y = −5.211E+01, X5Y2 = −4.170E+01, X4Y3 = −3.794E+01,
X3Y4 = 1.744E+01, X2Y5 = 4.910E+00, XY6 = 1.145E+01,
Y7 = 2.032E+01, X8 = −8.131E+01, X7Y = 2.452E+01,
X6Y2 = −7.994E+01, X5Y3 = −1.034E+02, X4Y4 = −1.579E+02,
X3Y5 = −7.070E+01, X2Y6 = 7.324E+01, XY7 = −1.309E+01,
Y8 = −4.040E+00, X9 = 2.786E+01, X8Y = 6.013E+01,
X7Y2 = 1.959E+02, X6Y3 = 8.620E+02, X5Y4 = −6.561E+01,
X4Y5 = 6.569E+02, X3Y6 = −2.710E+02, X2Y7 = 1.592E+02,
XY8 = −1.469E+02, Y9 = −1.115E+02, X10 = −2.883E+02,
X9Y = −3.923E+02, X8Y2 = −4.066E+03, X7Y3 = 2.350E+02,
X6Y4 = −3.580E+03, X5Y5 = 2.586E+03, X4Y6 = −6.822E+03,
X3Y7 = 4.795E+02, X2Y8 = −4.836E+03, XY9 = 5.074E+02,
Y10 = −4.879E+02
Free-form surface coefficient
Fifth plane Y = −1.200E−01, X2 = −5.991E−01, XY = 3.956E−02,
Y2 = −8.312E−01, X3 = −1.645E−01, X2Y = −1.262E+00,
XY2 = 4.011E−01, Y3 = −5.793E−01, X4 = −2.964E+00,
X3Y = 8.447E−01, X2Y2 = −2.988E+00, XY3 = 4.505E−01,
Y4 = −1.957E+00, X5 = −8.282E−01, X4Y = −1.741E+00,
X3Y2 = 3.807E−01, X2Y3 = 2.135E+00, XY4 = 8.634E−01,
Y5 = 1.501E+00, X6 = 1.003E+01, X5Y = 7.913E−01,
X4Y2 = 1.025E+01, X3Y3 = 1.247E+01, X2Y4 = 1.342E+01,
XY5 = 1.541E+00, Y6 = 1.309E+01, X7 = 2.100E+01,
X6Y = 2.226E+01, X5Y2 = 3.391E+01, X4Y3 = 1.558E+01,
X3Y4 = 3.105E+00, X2Y5 = 2.382E+01, XY6 = 5.916E+00,
Y7 = −3.586E+01, X8 = −1.006E+02, X7Y = −1.095E+01,
X6Y2 = −2.419E+02, X5Y3 = 1.350E+01, X4Y4 = −2.254E+02,
X3Y5 = 6.799E−01, X2Y6 = −2.469E+02, XY7 = 7.454E+00,
Y8 = −1.275E+02, X9 = 7.505E+01, X8Y = −1.092E+02,
X7Y2 = −6.000E+01, X6Y3 = −8.692E+01, X5Y4 = −6.846E+00,
X4Y5 = −1.270E+02, X3Y6 = 1.207E+01, X2Y7 = −1.390E+02,
XY8 = 3.464E+01, Y9 = 1.163E+01, X10 = 6.123E+01,
X9Y = 8.967E+02, X8Y2 = −3.488E+02, X7Y3 = −5.052E+02,
X6Y4 = 1.241E+03, X5Y5 = −5.379E+02, X4Y6 = 1.069E+03,
X3Y7 = −2.135E+02, X2Y8 = 7.053E+02, XY9 = −3.848E+01,
Y10 = 3.955E+02
Free-form surface coefficient
Eighth plane X2 = 1.959E+00, XY = −1.508E−01, Y2 = 1.211E+00,
X3 = −3.859E−01, X2Y = −2.238E+00, XY2 = 6.912E−01,
Y3 = −1.105E+00, X4 = −2.444E+00, X3Y = 1.212E+00,
X2Y2 = 3.967E+00, XY3 = −2.600E−02, Y4 = 1.631E+00,
X5 = −6.429E−01, X4Y = 4.968E+00, X3Y2 = 1.246E+00,
X2Y3 = −2.948E−01, XY4 = 1.649E+00, Y5 = 2.699E+00,
X6 = 4.680E+01, X5Y = 3.227E+00, X4Y2 = 8.455E+01,
X3Y3 = 1.903E+00, X2Y4 = 9.123E+01, XY5 = 3.318E+00,
Y6 = 1.904E+01, X7 = 9.566E+00, X6Y = −1.944E+02,
X5Y2 = −2.034E+00, X4Y3 = −6.620E+01, X3Y4 = 2.015E+01,
X2Y5 = 4.157E+01, XY6 = 6.231E+00, Y7 = −1.327E+01,
X8 = −1.610E+02, X7Y = −3.066E+01, X6Y2 = −3.407E+02,
X5Y3 = −1.603E+01, X4Y4 = −1.279E+03, X3Y5 = 1.097E+01,
X2Y6 = −9.849E+02, XY7 = 3.058E+01, Y8 = −2.100E+02,
X9 = 3.779E+02, X8Y = 1.457E+03, X7Y2 = 6.346E+02,
X6Y3 = 1.397E+03, X5Y4 = −7.076E+01, X4Y5 = −2.317E+00,
X3Y6 = −2.093E+02, X2Y7 = −2.141E+02, XY8 = 6.833E+01,
Y9 = −4.904E+01, X10 = −2.890E+02, X9Y = −1.236E+03,
X8Y2 = −2.272E+03, X7Y3 = −1.840E+03, X6Y4 = 7.906E+03, X5Y5 = 7.324E+02, X4Y6 = 1.060E+04, X3Y7 = −1.234E+02,
X2Y8 = 5.755E+03, XY9 = −1.060E+02, Y10 = 9.897E+02

Position: D1 (90-Degree Rotation)

Unit: mm

Plane data

| Plane number | C0 | d | Y decentering | X decentering |
|---|---|---|---|---|
| 1 | 0.8509305 | 0.156 | 0.000 | 0.000 |
| 2 | 0 | 0.305 | 0.056 | 0.062 |
| 3 | 0 | 0.035 | 0.056 | 0.062 |
| 4 | 3.03846 | 0.872 | 0.120 | 0.129 |
| 5 | 2.066558 | 0.050 | 0.679 | 0.607 |
| 6 | 0 | 0.300 | 0.679 | 0.607 |
| 7 | 0 | 0.094 | 0.679 | 0.607 |
| 8 | −2.391376 | 0.102 | 0.930 | 0.655 |
| 9 | 0 | 0.500 | 1.169 | 0.835 |
| 10 | 0 | 0.050 | 1.169 | 0.835 |

Free-form surface coefficient
First plane

X = −1.332E−01, Y = −5.273E−02, X2 = 1.481E−01,
XY = 5.171E−05, Y2 = 2.364E−01, X3 = −3.973E−05,
X2Y = 2.215E−02, XY2 = 4.181E−04, Y3 = 8.330E−03,
X4 = 1.059E−01, X3Y = 7.962E−04, X2Y2 = 5.188E−01,
XY3 = 3.031E−03, Y4 = 2.135E−01, X5 = −1.426E−04,
X4Y = −8.646E−02, X3Y2 = 3.051E−03, X2Y3 = −6.310E−02,
XY4 = −9.572E−03, Y5 = 1.490E−01, X6 = 4.921E−01,
X5Y = 2.246E−02, X4Y2 = 2.064E+00, X3Y3 = 1.799E−02,
X2Y4 = 2.224E+00, XY5 = −3.816E−02, Y6 = 5.927E−01,
X7 = 6.678E−04, X6Y = 7.171E−01, X5Y2 = −3.800E−02,
X4Y3 = −7.353E−01, X3Y4 = 1.386E−01, X2Y5 = −1.834E+00,
XY6 = 4.722E−02, Y7 = −4.578E−01, X8 = −3.851E+00,
X7Y = −3.278E−01, X6Y2 = −1.128E+01, X5Y3 = −5.266E−03,
X4Y4 = −1.464E+01, X3Y5 = −1.031E+00, X2Y6 = −1.340E+01,
XY7 = 5.227E−02, Y8 = −2.628E+00, X9 = 3.096E−02,
X8Y = 1.792E+01, X7Y2 = −1.206E+00, X6Y3 = 5.553E+01,
X5Y4 = −1.963E+00, X4Y5 = 4.062E+01, X3Y6 = 4.309E+00,
X2Y7 = −9.256E+00, XY8 = 6.265E−01, Y9 = 3.247E+01,
X10 = 1.153E+01, X9Y = −6.218E+00, X8Y2 = 7.569E+01,
X7Y3 = −1.225E+01, X6Y4 = 7.654E+01, X5Y5 = −3.033E+01,
X4Y6 = 1.818E+02, X3Y7 = 3.217E+00, X2Y8 = 4.423E+01
Free-form surface coefficient
Fourth plane X = −5.759E−02, Y = −3.142E−02, X2 = −1.299E+00,
XY = 3.179E−02, Y2 = −1.175E+00, X3 = 2.674E−01,
X2Y = −2.538E−02, XY2 = 2.919E−01, Y3 = 3.291E−01,
X4 = −4.311E+00, X3Y = −1.516E−01, X2Y2 = −5.115E+00,
XY3 = 2.811E−01, Y4 = −2.863E+00, X5 = −1.191E+00,
X4Y = 1.460E+01, X3Y2 = 4.597E−01, X2Y3 = 4.363E+00,
XY4 = −4.809E−01, Y5 = −5.224E−01, X6 = −4.041E−01,
X5Y = 1.352E+01, X4Y2 = −6.446E+01, X3Y3 = −1.204E+01,
X2Y4 = −9.235E+01, XY5 = −5.247E+00, Y6 = −1.307E+01,
X7 = −3.142E−03, X6Y = −3.244E+02, X5Y2 = −9.404E−02,
X4Y3 = 6.440E+00, X3Y4 = 9.249E+01, X2Y5 = −4.700E+01,
XY6 = 3.748E+01, Y7 = 3.975E+01, X8 = −1.627E+01,
X7Y = 7.570E−02, X6Y2 = 5.417E+01, X5Y3 = −5.144E−01,
X4Y4 = −1.216E+03, X3Y5 = −5.523E−03, X2Y6 = 1.829E+02,
XY7 = −3.215E−03, Y8 = −2.518E+02, X9 = −1.674E+01,
X8Y = 2.947E+01, X7Y2 = 1.318E−01, X6Y3 = −1.942E+02,
X5Y4 = 1.305E+00, X4Y5 = 1.015E+02, X3Y6 = 4.296E−01,
X2Y7 = −5.385E+01, XY8 = −1.065E−01, Y9 = −1.769E+02,
X10 = 1.333E+02, X9Y = 5.210E+00, X8Y2 = −2.898E+02,
X7Y3 = −1.806E+01, X6Y4 = 5.520E+02, X5Y5 = 2.873E+00,
X4Y6 = 1.884E+02, X3Y7 = 7.997E−01, X2Y8 = −3.562E+02,
XY9 = −3.939E−01, Y10 = −3.786E+01
Free-form surface coefficient
Fifth plane X = 6.069E−02, Y = −9.042E−02, X2 = −7.967E−01,
XY = −1.023E−01, Y2 = −1.100E+00, X3 = −4.248E−01,
X2Y = −1.195E+00, XY2 = 4.263E−01, Y3 = −6.982E−01,
X4 = −4.930E+00, X3Y = −5.400E−01, X2Y2 = −3.295E+00,
XY3 = 1.480E+00, Y4 = −7.855E−01, X5 = −1.384E+00,
X4Y = −3.968E+00, X3Y2 = −3.572E+00, X2Y3 = 1.530E+00,
XY4 = −2.599E+00, Y5 = 4.053E+00, X6 = 3.270E+01,
X5Y = −2.233E+00, X4Y2 = 4.741E+00, X3Y3 = −1.747E+01,
X2Y4 = 4.620E+00, XY5 = −2.445E−03, Y6 = −6.190E+00,
X7 = 2.556E−02, X6Y = 2.117E+01, X5Y2 = −1.112E+02,
X4Y3 = −4.277E+01, X3Y4 = 9.229E+01, X2Y5 = 2.923E+01,
XY6 = 8.418E−02, Y7 = −6.401E+01, X8 = −3.353E+02,
X7Y = 3.465E−02, X6Y2 = −6.826E+02, X5Y3 = 3.525E−01,
X4Y4 = −1.440E+02, X3Y5 = −1.216E−01, X2Y6 = −2.287E+02,
XY7 = −2.559E+01, Y8 = −6.273E+01, X9 = 2.381E−03,
X8Y = −2.438E+02, X7Y2 = −5.061E−01, X6Y3 = −8.200E+01,
X5Y4 = −3.359E−01, X4Y5 = −1.266E+02, X3Y6 = 1.617E+00,
X2Y7 = −2.208E+02, XY8 = 1.967E−01, Y9 = 3.739E+02,
X10 = 1.281E+03, X9Y = −2.271E+00, X8Y2 = 8.767E+02,
X7Y3 = 1.862E+00, X6Y4 = 1.968E+03, X5Y5 = 2.385E+00,
X4Y6 = 1.282E+03, X3Y7 = −2.724E+00, X2Y8 = 1.031E+03,
XY9 = −1.000E+00, Y10 = 3.599E+02
Free-form surface coefficient
Eighth plane X = −4.283E−04, Y = −3.215E−02, X2 = 2.003E+00,
XY = −1.209E−04, Y2 = 1.165E+00, X3 = −2.680E−04,
X2Y = −1.932E+00, XY2 = −1.084E−03, Y3 = −8.510E−01,
X4 = −2.891E+00, X3Y = 3.983E−03, X2Y2 = 3.601E+00,
XY3 = 1.714E−03, Y4 = 2.321E+00, X5 = 6.120E−03,
X4Y = 2.694E+00, X3Y2 = −1.465E−02, X2Y3 = −2.248E+00,
XY4 = 7.988E−03, Y5 = 2.223E+00, X6 = 4.380E+01,
X5Y = 1.008E−02, X4Y2 = 6.944E+01, X3Y3 = 6.270E−02,
X2Y4 = 9.703E+01, XY5 = 6.229E−02, Y6 = 2.004E+01,
X7 = 8.757E−02, X6Y = −1.995E+02, X5Y2 = −2.734E−01,
X4Y3 = −5.042E+01, X3Y4 = 4.367E−01, X2Y5 = 7.235E+01,
XY6 = −1.257E−01, Y7 = −1.632E+01, X8 = −2.139E+02,
X7Y = 1.709E+00, X6Y2 = −3.154E+02, X5Y3 = −5.113E−01,
X4Y4 = −1.261E+03, X3Y5 = 8.526E−01, X2Y6 = −1.030E+03,
XY7 = −1.094E+00, Y8 = −2.169E+02, X9 = 6.529E−01,
X8Y = 1.718E+03, X7Y2 = −5.369E+00, X6Y3 = 1.646E+03,
X5Y4 = 3.031E+00, X4Y5 = −6.258E+02, X3Y6 = −7.979E−01,
X2Y7 = −2.917E+02, XY8 = −5.399E−01, Y9 = −4.715E+01,
X10 = −1.480E+03, X9Y = −1.136E+01, X8Y2 = −2.847E+03,
X7Y3 = −2.218E+01, X6Y4 = 7.360E+03, X5Y5 = −4.795E+00,
X4Y6 = 1.130E+04, X3Y7 = 1.360E+01, X2Y8 = 5.383E+03,
XY9 = −2.840E+00, Y10 = 8.617E+02

Position: D2 (90-Degree Rotation)

Unit: mm

Plane data

| Plane number | C0 | d | Y decentering | X decentering |
|---|---|---|---|---|
| 1 | −0.047356 | 0.153 | 0.000 | 0.000 |
| 2 | 0 | 0.305 | 0.029 | 0.024 |
| 3 | 0 | 0.050 | 0.029 | 0.024 |
| 4 | 2.8552766 | 0.843 | 0.058 | 0.050 |
| 5 | 2.3216459 | 0.058 | 0.353 | 0.265 |
| 6 | 0 | 0.300 | 0.353 | 0.265 |
| 7 | 0 | 0.053 | 0.353 | 0.265 |
| 8 | −2.430046 | 0.147 | 0.452 | 0.313 |

-continued

| | | Unit: mm | | |
|---|---|---|---|---|
| 9 | 0 | 0.500 | 0.603 | 0.398 |
| 10 | 0 | 0.050 | 0.603 | 0.398 |

Free-form surface coefficient
First plane

X = −2.193E−02, Y = −2.430E−02, X2 = 8.033E−01,
XY = 2.515E−04, Y2 = 8.209E−01, X3 = −3.260E−02,
X2Y = 8.736E−02, XY2 = 3.878E−02, Y3 = 1.322E−02,
X4 = 4.957E−01, X3Y = −7.800E−02, X2Y2 = 9.530E−01,
XY3 = −1.130E−01, Y4 = 4.506E−01, X5 = −7.723E−02,
X4Y = 1.447E−01, X3Y2 = −1.608E−01, X2Y3 = 5.339E−02,
XY4 = 4.030E−02, Y5 = −2.232E−02, X6 = 1.364E+00,
X5Y = 1.574E+00, X4Y2 = 7.622E−01, X3Y3 = 3.426E+00,
X2Y4 = 2.311E+00, XY5 = 1.316E+00, Y6 = 2.146E+00,
X7 = 4.344E−01, X6Y = 5.468E−01, X5Y2 = 1.906E+00,
X4Y3 = 3.345E+00, X3Y4 = 2.089E+00, X2Y5 = 3.331E+00,
XY6 = 1.018E+00, Y7 = 5.358E−01, X8 = −5.938E+00,
X7Y = −1.453E+01, X6Y2 = 1.445E+01, X5Y3 = −5.252E+01,
X4Y4 = 1.915E+01, X3Y5 = −5.023E+01, X2Y6 = −1.004E+01,
XY7 = −1.160E+01, Y8 = −1.141E+01, X9 = −2.097E+00,
X8Y = −3.398E−02, X7Y2 = −1.010E+01, X6Y3 = −5.287E+00,
X5Y4 = −1.649E+01, X4Y5 = −2.073E+01, X3Y6 = −8.978E+00,
X2Y7 = −1.216E+01, XY8 = −3.179E+00, Y9 = −2.073E+00,
X10 = 2.996E+01, X9Y = 3.615E+01, X8Y2 = 1.127E+01,
X7Y3 = 1.904E+02, X6Y4 = −1.879E+01, X5Y5 = 2.964E+02,
X4Y6 = 4.204E+01, X3Y7 = 1.599E+02, X2Y8 = 1.023E+02,
XY9 = 2.185E+01, Y10 = 4.209E+01
Free-form surface coefficient
Fourth plane X = −1.239E−02, Y = −3.480E−03, X2 = −9.949E−01,
XY = 5.972E−04, Y2 = −9.646E−01, X3 = 7.955E−02,
X2Y = 4.600E−01, XY2 = 2.941E−01, Y3 = 2.731E−01,
X4 = −1.449E+00, X3Y = 9.403E−02, X2Y2 = −2.927E+00,
XY3 = 2.765E−02, Y4 = −1.393E+00, X5 = 1.001E+00,
X4Y = 2.102E+00, X3Y2 = 1.869E+00, X2Y3 = 3.237E+00,
XY4 = 1.488E+00, Y5 = 1.739E+00, X6 = −3.750E+01,
X5Y = 6.935E+00, X4Y2 = −1.117E+02, X3Y3 = 1.394E+01,
X2Y4 = −1.134E+02, XY5 = 5.879E+00, Y6 = −3.700E+01,
X7 = −5.596E+00, X6Y = −1.005E+01, X5Y2 = −1.717E+01,
X4Y3 = −1.250E+01, X3Y4 = −1.367E+01, X2Y5 = −1.895E+01,
XY6 = −5.521E+00, Y7 = −1.359E+01, X8 = 4.433E+02,
X7Y = −9.408E+01, X6Y2 = 1.771E+03, X5Y3 = −3.509E+02,
X4Y4 = 2.653E+03, X3Y5 = −3.275E+02, X2Y6 = 1.846E+03,
XY7 = −9.007E+01, Y8 = 4.475E+02, X9 = 6.760E+01,
X8Y = 1.658E+02, X7Y2 = 3.041E+02, X6Y3 = 4.473E+02,
X5Y4 = 4.318E+02, X4Y5 = 5.537E+02, X3Y6 = 2.841E+02,
X2Y7 = 4.327E+02, XY8 = 9.560E+01, Y9 = 1.421E+02,
X10 = −3.574E+03, X9Y = 5.624E+02, X8Y2 = −1.801E+04,
X7Y3 = 2.887E+03, X6Y4 = −3.512E+04, X5Y5 = 4.426E+03,
X4Y6 = −3.594E+04, X3Y7 = 2.511E+03, X2Y8 = −1.851E+04,
XY9 = 5.426E+02, Y10 = −3.573E+03
Free-form surface coefficient
Fifth plane X = −2.390E−02, Y = 1.662E−02, X2 = −1.097E+00,
XY = −1.743E−01, Y2 = −1.066E+00, X3 = −9.320E−01,
X2Y = −2.470E−01, XY2 = −1.448E−01, Y3 = −6.536E−01,
X4 = −2.975E+00, X3Y = 1.601E+00, X2Y2 = −4.166E+00,
XY3 = 1.330E+00, Y4 = −2.766E+00, X5 = 3.788E+00,
X4Y = 1.235E−01, X3Y2 = 1.753E+00, X2Y3 = 5.388E+00,
XY4 = −3.706E+00, Y5 = 3.866E+00, X6 = 2.511E+01,
X5Y = −3.542E+00, X4Y2 = −2.268E+01, X3Y3 = 1.795E+00,
X2Y4 = −3.121E+01, XY5 = −9.832E+00, Y6 = 1.445E+01,
X7 = −2.532E+01, X6Y = 8.865E+01, X5Y2 = 1.602E−01,
X4Y3 = 9.470E+00, X3Y4 = 4.930E+01, X2Y5 = −1.843E+01,
XY6 = 1.032E+02, Y7 = −2.758E+01, X8 = −3.383E+02,
X7Y = 2.958E+02, X6Y2 = 7.710E+01, X5Y3 = 1.239E+02,
X4Y4 = 6.315E+02, X3Y5 = 7.467E+01, X2Y6 = 4.029E+02,
XY7 = 2.572E+02, Y8 = −1.628E+02, X9 = 1.486E+02,
X8Y = −2.283E+02, X7Y2 = 1.191E+02, X6Y3 = −4.526E+02,
X5Y4 = −2.163E+02, X4Y5 = 1.380E+02, X3Y6 = −4.210E+02,
X2Y7 = 8.185E+01, XY8 = −5.168E+02, Y9 = 1.722E+02,
X10 = 1.191E+03, X9Y = −1.369E+03, X8Y2 = −8.551E+02,
X7Y3 = −1.706E+03, X6Y4 = −4.823E+03, X5Y5 = −1.283E+03, -continued

| Unit: mm |
|---|

X4Y6 = −6.330E+03, X3Y7 = −4.948E+02, X2Y8 = −3.122E+03,
XY9 = −1.496E+03, Y10 = 5.874E+02
Free-form surface coefficient
Eighth plane X = 7.164E−02, Y = 9.871E−02, X2 = 1.748E+00,
XY = −4.022E−01, Y2 = 1.622E+00, X3 = −1.126E+00,
X2Y = −7.848E−01, XY2 = 1.775E−02, Y3 = −1.165E+00,
X4 = 1.266E+00, X3Y = 3.701E+00, X2Y2 = −9.767E−01,
XY3 = 1.856E+00, Y4 = 8.312E−01, X5 = −1.668E−01,
X4Y = 1.656E+00, X3Y2 = 3.667E+00, X2Y3 = 1.030E+01,
XY4 = −4.692E+00, Y5 = 6.104E+00, X6 = −2.624E+01,
X5Y = −4.944E+01, X4Y2 = 1.529E+02, X3Y3 = −2.405E+01,
X2Y4 = 1.212E+02, XY5 = −1.400E+01, Y6 = 2.007E+01,
X7 = 7.455E+00, X6Y = −5.104E+01, X5Y2 = −1.010E+02,
X4Y3 = −7.803E+01, X3Y4 = 4.127E+00, X2Y5 = −1.203E+02,
XY6 = 3.288E+01, Y7 = −4.747E+01, X8 = 1.506E+03,
X7Y = 5.126E+02, X6Y2 = −2.144E+03, X5Y3 = 6.463E+02,
X4Y4 = −2.177E+03, X3Y5 = 3.237E+01, X2Y6 = −1.240E+03,
XY7 = 1.571E+02, Y8 = −1.167E+02, X9 = 3.505E+02,
X8Y = 8.513E+02, X7Y2 = 1.047E+03, X6Y3 = 5.063E+02,
X5Y4 = 7.300E+01, X4Y5 = 4.202E+02, X3Y6 = −1.382E+02,
X2Y7 = 6.045E+02, XY8 = 8.528E+01, Y9 = 1.967E+02,
X10 = −1.466E+04, X9Y = −7.133E+02, X8Y2 = 1.263E+04,
X7Y3 = −5.046E+03, X6Y4 = 1.764E+04, X5Y5 = −1.492E+03,
X4Y6 = 1.606E+04, X3Y7 = 6.352E+02, X2Y8 = 6.686E+03,
XY9 = −4.887E+02, Y10 = 9.862E+02

Position: Zentai

| | Plane data | | | |
|---|---|---|---|---|
| | | Unit: mm | | |
| Plane number | C0 | d | nd | vd |
| 1 | −0.006592 | 0.215 | 1.5178 | 56.1 |
| 2 | 0 | 0.305 | 1.5100 | 62.4 |
| 3 | 0 | 0.050 | 1.6020 | 28.6 |
| 4 | −0.959936 | 0.850 | | |
| 5 | −0.108578 | 0.050 | 1.6020 | 28.6 |
| 6 | 0 | 0.300 | 1.5100 | 62.4 |
| 7 | 0 | 0.179 | 1.5178 | 56.1 |
| 8 | −1.339709 | 0.021 | | |
| 9 | 0 | 0.500 | 1.4714 | 66.02 |
| 10 | 0 | 0.050 | | |

Aspherical surface coefficient
First plane

A4 = −4.087E−01
A6 = −2.315E+00
A8 = −4.957E+01
A10 = 8.716E+02
A12 = 1.186E+04
A14 = −2.680E+05
A16 = 1.113E+06
A18 = 0.000E+00
Aspherical surface coefficient
Fourth plane A4 = 1.714E−01
A6 = −1.098E+01
A8 = 1.081E+02
A10 = 7.077E+02
A12 = −1.702E+04
A14 = 4.221E+04
A16 = 2.209E+05
A18 = 0.000E+00
Aspherical surface coefficient
Fifth plane

A4 = −3.811E−01
A6 = 5.801E+00
A8 = −6.603E+01

-continued

Unit: mm

A10 = 2.424E+02
A12 = −1.074E+02
A14 = −2.199E+02
A16 = −2.461E+03
A18 = 0.000E+00
Aspherical surface coefficient
Eighth plane A4 = 1.401E+00
A6 = 1.055E+01
A8 = −3.211E+02
A10 = 3.237E+03
A12 = −1.658E+04
A14 = 4.278E+04
A16 = −4.404E+04
A18 = 0.000E+00

REFERENCE SIGNS LIST

DU Imaging device
LU Imaging unit
LA1 First lens array plate
LA2 Second lens array plate
LH Compound eye optical system
Ln (n=1, 2, 3 . . . ) Individual eye optical system
L0 Overall optical system
L01, L02, L03 Overall optical system
Zn (n=1, 2, 3 . . . ) Individual eye image
Z0 Overall image
Pn (n=1, 2, 3 . . . ) Individual eye position (individual eye region)
P01, P02, P03 Overall position (overall region)
ML Individual eye composite image
M0 Overall image
SL Composite field of view
S0 Overall field of view
SR Imaging element
SS Light reception surface (imaging surface)
CG Cover glass
AX Optical axis
1 Image processing unit
1a Image composition unit
1b Image correction unit
1c Output image processing unit
2 Calculating unit
3 Memory

The invention claimed is:

1. An imaging device comprising:
an imaging element;
a compound eye optical system forming a plurality of images with different fields of view for the imaging element; and
an image processing unit that connects the plurality of images with the different fields of view formed by the compound eye optical system and outputs one composite image,
wherein the compound eye optical system includes a plurality of individual eye optical systems that forms the plurality of images with different fields of view on an imaging surface of the imaging element, and an overall optical system that forms an image with a field of view incorporating an entire field of view obtained by the plurality of individual eye optical systems on the imaging surface, the field of view of the overall optical system being larger than the entire fields of view obtained by the plurality of individual eye optical systems,
wherein the individual eye optical systems and the overall optical system are configured by a lens array plate having a plurality of lenses integrally formed,
wherein the image processing unit corrects to improve image quality of the composite image using information of the image obtained by the overall optical system,
wherein the information of the image obtained by the overall optical system is: (a) crosstalk that causes ghost, and the image processing unit identifies the crosstalk caused in the composite image and corrects to make the ghost less visible, (b) the information of the image obtained by the overall optical system is shading and the image processing unit corrects luminance distribution of the composite image using luminance distribution information of the image of the overall optical system, or both (a) and (b).

2. The imaging device according to claim 1, wherein the imaging surface is in one imaging element.

3. The imaging device according to claim 1, wherein the lens array plate includes at least two pieces.

4. The imaging device according to claim 1, wherein the information of the image obtained by the overall optical system is a seam of the composite image and the image processing unit corrects seam distribution of the composite image using the image information of the overall optical system.

5. An imaging device comprising:
an imaging element;
a compound eye optical system forming a plurality of images with different fields of view for the imaging element; and
an image processing unit that connects the plurality of images with the different fields of view formed by the compound eye optical system and outputs one composite image,
wherein the compound eye optical system includes a plurality of individual eye optical systems that forms the plurality of images with different fields of view on an imaging surface of the imaging element, and an overall optical system that forms an image with a field of view incorporating an entire field of view obtained by the plurality of individual eye optical systems on the imaging surface,
wherein the individual eye optical systems and the overall optical system are configured by a lens array plate having a plurality of lenses integrally formed,
wherein the image processing unit has a function of outputting a moving image, a function of outputting a live view, and a function of outputting a still image, and
wherein in the output of a still image, the image processing unit performs image processing for outputting the composite image and in the output of a moving image or live view, the image processing unit outputs using the image information of the overall optical system.

6. The imaging device according to claim 5, wherein when it is assumed that the image formed by the individual eye optical system is an individual eye image, the image formed by the overall optical system is an overall image, and regions where the individual eye image and the overall image are formed on the imaging surface of the imaging element are an individual eye region and an overall region, respectively, a space between the individual eye region and the overall region is larger than a space between the individual eye regions.

7. The imaging device according to claim 5, wherein other individual eye optical systems than the individual eye optical system having an optical axis perpendicular to the imaging surface are decentered optical systems with at least one free-form surface.

8. The imaging device according to claim 5, wherein the number of individual eye optical systems is three or more in each of vertical and horizontal directions, so that the individual eye optical systems form the images with the fields of view displaced in the vertical and horizontal directions in 3×3 or more array.

9. The imaging device according to claim 5, wherein the lens array plate includes at least two pieces.

10. The imaging device according to claim 5, wherein the image processing unit corrects to improve image quality of the composite image using information of the image obtained by the overall optical system.

11. An imaging device comprising:

an imaging element;

a compound eye optical system forming a plurality of images with different fields of view for the imaging element; and an image processing unit that connects the plurality of images with the different fields of view formed by the compound eye optical system and outputs one composite image, wherein the compound eye optical system includes a plurality of individual eye optical systems that forms the plurality of images with different fields of view on an imaging surface of the imaging element, and an overall optical system that forms an image with a field of view incorporating an entire field of view obtained by the plurality of individual eye optical systems on the imaging surface, the field of view of the overall optical system being larger than the entire fields of view obtained by the plurality of individual eye optical systems, wherein the individual eye optical systems and the overall optical system are configured by a lens array plate having a plurality of lenses integrally formed, and wherein when the image formed by the individual eye optical system is an individual eye image, peripheries of the fields of view of the individual eye images are overlapped on each other and the amount of overlapping satisfies the condition of formula (1):

$$0.01 < La/Lb < 0.5 \qquad (1)$$

where La is the amount of overlapping, and Lb is the width of a screen in an overlapping direction.

* * * * *